US008851736B2

(12) United States Patent
Lee et al.

(10) Patent No.: US 8,851,736 B2
(45) Date of Patent: Oct. 7, 2014

(54) LIGHT EMITTING MODULE WITH HEATSINK PLATE HAVING COUPLING PROTRUSIONS

(75) Inventors: Song Eun Lee, Seoul (KR); Bong Kul Min, Seoul (KR); Kyung Ho Shin, Seoul (KR); Ki Bum Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 122 days.

(21) Appl. No.: 13/372,857

(22) Filed: Feb. 14, 2012

(65) Prior Publication Data

US 2013/0051062 A1    Feb. 28, 2013

(30) Foreign Application Priority Data

Aug. 30, 2011 (KR) .......... 10-2011-0087405
Oct. 10, 2011 (KR) .......... 10-2011-0103173
Oct. 12, 2011 (KR) .......... 10-2011-0104156

(51) Int. Cl.
*F21V 7/04* (2006.01)
*B60Q 1/06* (2006.01)
*F21V 29/00* (2006.01)
*H05K 1/02* (2006.01)

(52) U.S. Cl.
CPC .... *H05K 1/0209* (2013.01); *H05K 2201/10106* (2013.01); *H05K 2201/066* (2013.01)
USPC .......... 362/634; 362/373; 362/294; 362/612; 362/632; 362/633

(58) Field of Classification Search
USPC ......... 362/373, 294, 602, 612, 613, 632–634; 361/709, 715–719, 767
See application file for complete search history.

(56) References Cited

U.S. PATENT DOCUMENTS

| 6,428,189 | B1* | 8/2002 | Hochstein | 362/373 |
| 6,930,332 | B2* | 8/2005 | Hashimoto et al. | 257/98 |
| 2003/0189830 | A1* | 10/2003 | Sugimoto et al. | 362/294 |
| 2005/0180142 | A1* | 8/2005 | Tsai | 362/294 |
| 2006/0139932 | A1* | 6/2006 | Park | 362/294 |
| 2006/0285362 | A1* | 12/2006 | Cho et al. | 362/633 |
| 2008/0007963 | A1* | 1/2008 | Hsieh | 362/600 |
| 2008/0123340 | A1* | 5/2008 | McClellan | 362/294 |
| 2008/0278917 | A1 | 11/2008 | Lin et al. | |
| 2009/0219719 | A1* | 9/2009 | Hsu et al. | 362/249.02 |
| 2009/0225565 | A1* | 9/2009 | Zimmermann et al. | 362/555 |
| 2009/0316389 | A1* | 12/2009 | Park et al. | 362/97.1 |

(Continued)

FOREIGN PATENT DOCUMENTS

| EP | 1795951 A1 | 6/2007 |
| KR | 10-0685390 B1 | 2/2007 |
| WO | WO 2007/002644 A2 | 1/2007 |

*Primary Examiner* — Peggy Neils
*Assistant Examiner* — Erin Kryukova
(74) *Attorney, Agent, or Firm* — Birch, Stewart, Kolasch & Birch, LLP

(57) ABSTRACT

Provided are a light emitting module and a backlight unit. The light emitting module comprises a module board comprising a plurality of first and second pads and a plurality of protrusion holes, a heatsink plate corresponding to a second surface opposite to a first surface of the module board, the heatsink plate comprising a plurality of protrusions respectively inserted into the protrusion holes of the module board, and a plurality of light emitting devices, each comprising a heatsink frame connected to the protrusions of the heatsink plate which comprises a first frame part on which the plurality of protrusions are disposed and a second frame part folded from the first frame part and disposed under the module board.

18 Claims, 17 Drawing Sheets

(56) References Cited

U.S. PATENT DOCUMENTS

| | | |
|---|---|---|
| 2010/0027291 A1 | 2/2010 | Hamada |
| 2010/0188607 A1* | 7/2010 | Park et al. .................. 349/62 |
| 2010/0220463 A1* | 9/2010 | Kim et al. .................. 362/97.3 |
| 2011/0025944 A1* | 2/2011 | Lee et al. .................. 349/61 |
| 2011/0175119 A1* | 7/2011 | Kim et al. .................. 257/91 |
| 2011/0255030 A1* | 10/2011 | Pei .................. 349/62 |
| 2011/0273642 A1* | 11/2011 | Kweon et al. .................. 349/62 |

* cited by examiner

LIGHT EMITTING MODULE WITH HEATSINK PLATE HAVING COUPLING PROTRUSIONS

CROSS-REFERENCE TO RELATED APPLICATIONS

The present application claims priority under 35 U.S.C. §119(a) of Korean Patent Application No. 10-2011-0087405 filed on Aug. 30, 2011, No. 10-2011-0103173 filed on Oct. 10, 2011, and No 10-2011-0104156 filed on Oct. 12, 2011, all of which are hereby incorporated by reference in their entirety.

BACKGROUND

Embodiments relate to a light emitting module and a backlight unit having the same.

As information processing technologies are developed, display devices such as an LCD, a PDP, and an AMOLED are being widely used. The LCD of the display devices requires a backlight unit for generating light to display an image thereon.

In a light emitting module, a plurality of light emitting devices are mounted on a board, and external power is supplied through a connector to operate the plurality of light emitting devices.

To effectively release heat generated from the light emitting devices of the light emitting module, a structure using a heatsink plate is disclosed in Korean Patent Publication No. 10-2005-82374.

SUMMARY

Embodiments provide a light emitting module having a new structure and a backlight unit including the light emitting module.

Embodiments provide a light emitting module in which a plurality of protrusion holes are disposed in a module board and a plurality of protrusions are disposed on a heatsink plate, and the heatsink frame of a light emitting device disposed on the module board contacts the protrusions of the heatsink plate and a backlight unit including the light emitting module.

Embodiments provide a light emitting module in which a heatsink plate including a plurality of protrusions has a flat structure or a folded structure and a backlight unit including the light emitting module.

Embodiments provide a light emitting module in which a plurality of light emitting devices are disposed on a module board in a side view or/and top view type and a backlight unit including the light modules.

In one embodiment, a light emitting module comprises: a module board comprising a plurality of first and second pads on a first surface thereof and a plurality of protrusion holes in thereof; a heatsink plate corresponding to a second surface opposite to the first surface of the module board, the heatsink plate comprising a plurality of protrusions respectively inserted into the protrusion holes of the module board; and a plurality of light emitting devices, each comprising a heatsink frame connected to the protrusions of the heatsink plate, the plurality of light emitting devices being connected to the first and second pads of the module board, wherein the heatsink plate comprises: a first frame part on which the plurality of protrusions are disposed; and a second frame part folded from the first frame part and disposed under the module board.

In another embodiment, a light emitting module comprises: a module board comprising a plurality of first and second pads on a first surface thereof and a plurality of protrusion holes in thereof; a heatsink plate corresponding to a second surface, the heatsink plate comprising a plurality of protrusions respectively inserted into the protrusion holes of the module board; a plurality of light emitting devices, each comprising a heatsink frame connected to the protrusions of the heatsink plate, the plurality of light emitting devices being connected to the first and second pads of the module board; and an adhesion member between the protrusions of the heatsink plate and the heatsink frame of each of the light emitting devices, wherein the heatsink plate comprises a plurality of metal layer, and the heatsink plate comprises: a first frame part on which the module board is disposed, the first frame part comprising the plurality of protrusions; and a second frame part folded from the first frame part.

In further another embodiment, a backlight unit comprises: a light guide plate; a light emitting module disposed on at least one side surface of the light guide plate; and a bottom cover in which the light guide plate and the light emitting module are disposed, wherein the light emitting module comprises: a module board comprising a plurality of first and second pads on a first surface thereof and a plurality of protrusion holes in thereof; a heatsink plate corresponding to a second surface opposite to the first surface of the module board, the heatsink plate comprising a plurality of protrusions respectively inserted into the protrusion holes of the module board; and a plurality of light emitting devices, each comprising a heatsink frame connected to the protrusions of the heatsink plate, the plurality of light emitting devices being connected to the first and second pads of the module board, wherein the heatsink plate comprises: a first frame part on which the plurality of protrusions are disposed; and a second frame part folded from the first frame part and disposed under the module board.

The details of one or more embodiments are set forth in the accompanying drawings and the description below. Other features will be apparent from the description and drawings, and from the claims.

DETAILED DESCRIPTION OF THE EMBODIMENTS

In the descriptions of embodiments, it will be understood that when a substrate, a frame, a sheet, a layer or a pattern is referred to as being 'on' or 'under' another substrate, a frame, a sheet, a layer or a pattern, it can be directly on or under another layer or substrate, or intervening layers may also be present. Further, the reference about 'on' and 'under' each component layer will be made on the basis of drawings. In addition, the sizes of elements and the relative sizes between elements may be exaggerated for further understanding of the present disclosure.

Figure 1:
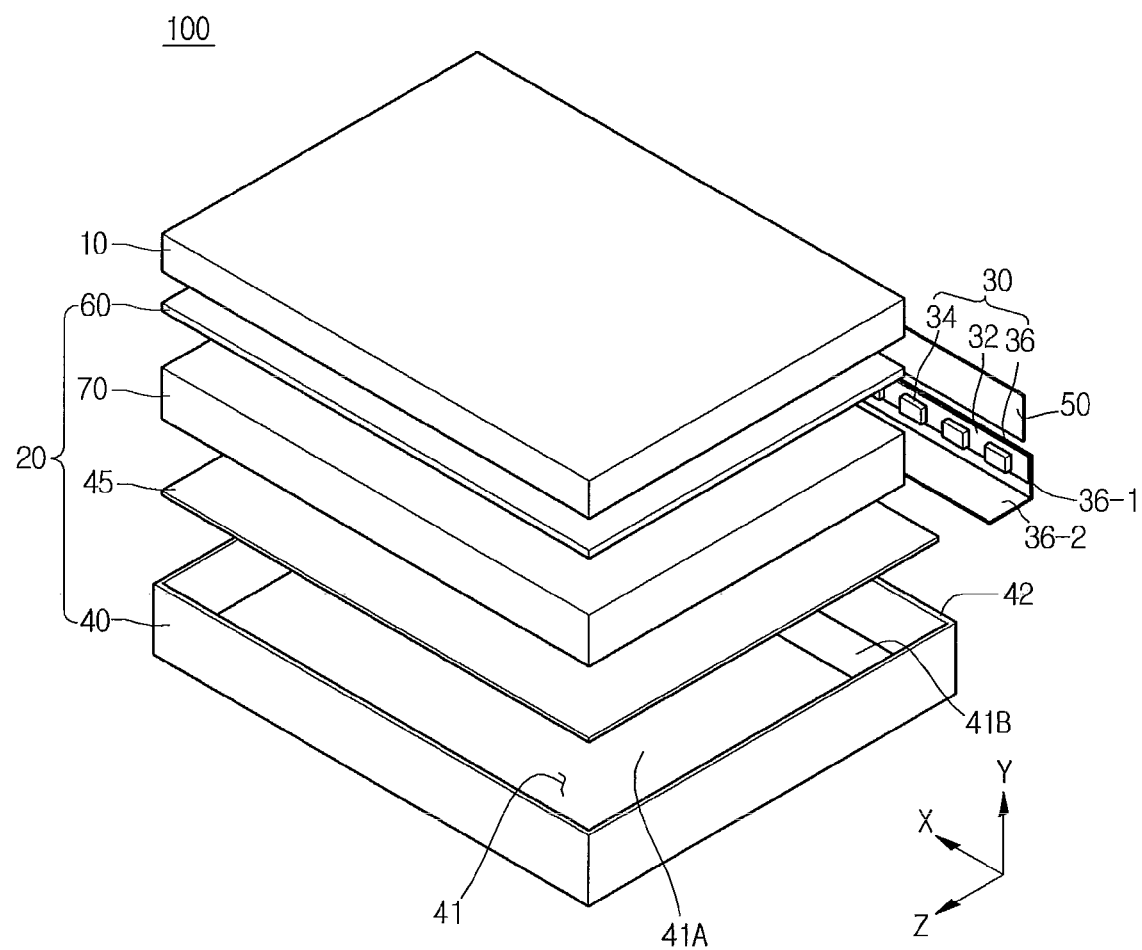
FIG. 1 is an exploded perspective view of a display device including a backlight unit according to a first embodiment.

FIG. 1 is an exploded perspective view of a display device including a backlight unit according to a first embodiment.

Referring to FIG. 1, a display device 100 include a display panel 10 on which an image is displayed and a backlight unit 20 providing light onto the display panel 10.

The backlight unit 20 includes a light guide plate 70 providing a surface light onto the display panel 10, a reflective member 45 disposed under the light guide plate 70 to reflect leaking light, a light emitting module providing light onto at least one side surface of the light guide plate 70, an optical sheet 60 disposed on the light guide plate 70, and a bottom cover defining a lower outer appearance of the display device 100. The backlight unit 20 may omit at least one of the reflective member 45 and the optical sheet 60.

Although not shown, the display device 100 may include a panel support supporting a lower portion of the display panel and a top cover defining a circumference of the display device 100 and surrounding the display panel 10 to support the display panel 10.

Although not shown in detail, the display panel 10 includes upper and lower substrates facing each other and coupled to each other to maintain a uniform cell gap therebetween and a liquid crystal layer (not shown) disposed between the upper and lower substrates. A plurality of gate lines and a plurality of data lines crossing the plurality of gate lines are disposed on the lower substrate. Thin film transistors (TFTs) may be disposed in crossing areas of the gate lines and the data lines, respectively. Color filters may be disposed on the upper substrate. The display panel 10 is not limited to the above-described structure. For example, the display panel 10 may have various structures. For another example, the lower substrate may include color filters as well as the TFTs. Also, the display panel 10 may have various structures according to a method of driving the liquid crystal layer.

Although not shown, a gate driving printed circuit board (PCB) supplying scan signals to the gate lines and a data driving PCB supplying data signals to the data lines may be disposed on an edge of the display panel 10.

A Polarizer film (not shown) may be disposed on at least one of upper and lower sides of the display panel 10. The optical sheet 60 may be disposed under the display panel 10. The optical sheet 60 may be included in the backlight unit 20 and include at least one prism sheet or/and diffusion sheet. The optical sheet 60 may be removed, but is not limited thereto.

The diffusion sheet may uniformly diffuse incident light, and then the diffused light may be collected into the display panel by the prism sheet. Here, the prism sheet may be selectively provided through combinations of a horizontal prism sheet or/and a vertical prism sheet and one or more illumination enhancement sheets. The types and number of optical sheets 60 may be varied within the scope of the present disclosure, but is not limited thereto.

At least one light emitting module 30 may be disposed on the backlight unit 20. The number of light emitting module 30 may be varied according to a size of the display panel 10, but is not limited thereto.

Figure 2:
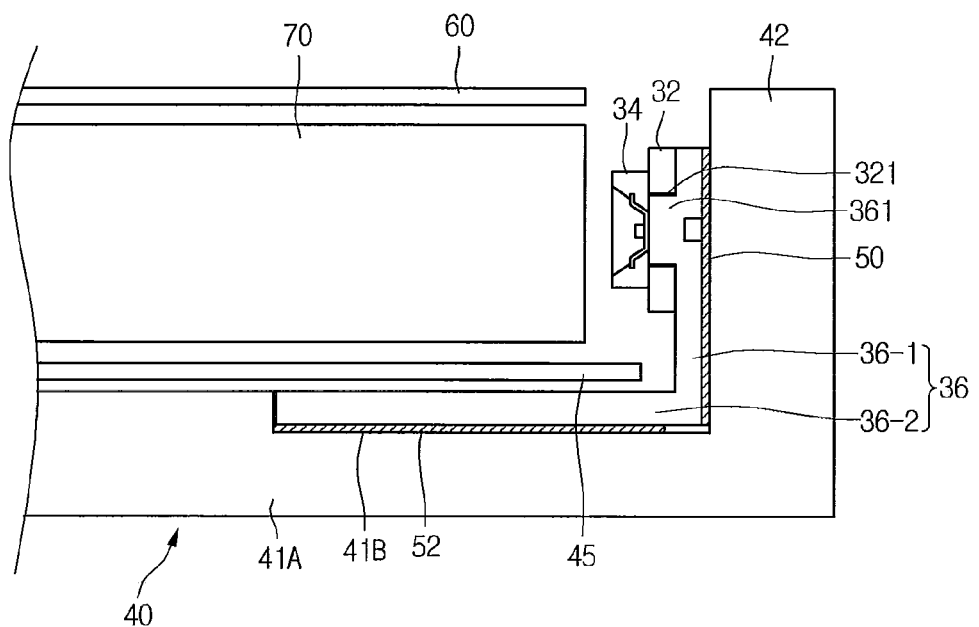
FIG. 2 is a side-sectional view illustrating the backlight unit of FIG. 1.

Referring to FIGS. 1 and 2, the light emitting module may be disposed on at least one of side surfaces of the bottom cover 40, e.g., an inner surface of a first side surface 42. Alternatively, the light emitting module 30 may be disposed on side surfaces different from each other, e.g., both side surfaces or the whole side surfaces, but are not limited thereto.

The light emitting module 30 includes a module board 32, a plurality of light emitting devices 34 arranged on a first surface of the module board 32, and a heatsink plate 36 supporting the module board 32 and connected to the light emitting device 34. An X-axis direction of the light emitting module 30 may be defined as a length direction, and Z-axis and Y-axis directions perpendicular to the X-axis direction may be defined as a width direction.

The module board 32 may include a resin-based printed circuit board (PCB), a metal core PCB, a flexible PCB, a ceramic PCB, and a FR-4 board. The module board 32 may include a resin-based board such as an epoxy board (e.g., the FR-4 board). The module board 32 may conduct heat generated from the light emitting device 34 into the heatsink plate 36 to radiate the heat. Thus, it may unnecessary to use the high-expensive MCPCB including a metal layer. Pads formed of a metal material may be arranged on the module board 32. A protection layer, e.g., a solder resistor may be further disposed around the pads to protect the pads, but is not limited thereto.

A connector may be disposed on the module board 32. The connector may be disposed on at least one of top and bottom surfaces of the module board 32, but is not limited thereto.

The plurality of light emitting devices 34 are arranged in a direction X of a light incident part of the light guide plate 70 with a predetermined pitch. At least one of the plurality of light emitting devices 34 may emit light having at least one color, e.g., at least one of a white color, a red color, a green color, and a blue color. In the current embodiment, light emitting devices 34 emitting light having at least one color may be provided, or light emitting devices 34 emitting light having a plurality of colors may be combined with each other. The plurality of light emitting devices 34 may include a white LED, combinations of red/green/blue LEDs, or combinations of white/red/green/blue LEDs, but is not limited thereto.

Each of the light emitting devices 34 may include a light emitting chip having a group III-V compound semiconductor and a molding member protecting the light emitting chip. At least one phosphor may be added to the molding member, but is not limited thereto. The light emitting chip may emit light a selective peak wavelength within a range from a visible light band to an ultraviolet band.

The light emitting devices 34 may be disposed in at least one row. Also, the light emitting devices 34 may be arranged at regular intervals or irregular intervals. The light emitting devices 34 may be electrically connected to the module board 32. For example, the light emitting devices 34 may be electrically connected using at least one method of a series method, a parallel method, and a series-parallel mixed method by a circuit pattern of the module board 32.

The heatsink plate 36 includes a first frame part 36-1 and a second frame part 36-2. The first frame part 36-1 is coupled to the module board 32 and corresponds to the light incident part of the light guide plate 70. The second frame part 36-2 corresponds to a bottom surface of the light guide plate 70 and is folded from the first frame part 36-1. The second frame part 36-2 may be nearly perpendicular to the first frame part 36-1 or inclined at a predetermined angle (e.g., about 70° to about 110°) with respect to the first frame part 36-1. The second frame part 36-2 may be spaced downward from the module board 32.

The first frame part 36-1 of the heatsink plate 36 may contact the module board 32 and be connected to portions of the plurality of light emitting devices 34. Here, the first frame part 36-1 may be directly connected to the portions of the plurality of light emitting devices 34 through a conductive material. Thus, heat generated from the plurality of light emitting devices 34 may be conduced into the second frame part 36-2 and radiated to the outside. A detailed configuration of the light emitting module will be described later.

The second frame part 36-2 may have an area greater than that of the first frame part 36-1. Thus, heat radiation efficiency of the light emitting module 30 may be improved.

The heatsink plate 36 may include a metal plate. That is, the heatsink plate 36 may be formed of at least one of Al, Cu, Fe, Ni, Mg, Zn, Ti, Ta, Hf, Nb, W, Mo, and stainless or an alloy of the selected metals thereof. For example, the heatsink plate 36 may be formed of Al or an Al alloy. Also, the heatsink plate 36 may be provided as a single or multi layer.

The heatsink plate 36 may have a thickness of about 0.5 mm or more, for example, a thickness of about 0.6 mm to about 1 mm. The first and second frame parts 36-1 and 36-2 may have the same thickness or thickness different from each other.

The first frame part 36-1 of the heatsink plate 36 may adhere to the first side surface 42 of the bottom cover 40 through an adhesion member 50. The first frame part 36-1 of the heatsink plate 36 may be coupled using a coupling member, but the adhesion member.

The plurality of light emitting devices 34 correspond to at least one side surface (i.e., the light incident part) of the light guide plate 70. Thus, light emitted from the plurality of light emitting devices 34 is incident through the at least one side surface. The light guide plate 70 may have a polygonal shape including a top surface through which the planar light is emitted, a bottom surface opposite to the top surface, and at least four side surfaces. The light guide plate 70 may be formed of a transparent material. For example, the light guide plate 70 may be formed of one of an acryl-based resin such as polymethyl metaacrylate (PMMA), polyethylene terephthlate (PET), poly carbonate (PC), and polyethylene naphthalate (PEN). The light guide plate 70 may be manufactured by an extrusion molding method, but is not limited thereto.

A reflective pattern (not shown) may be disposed on the top or/and bottom surface of the light guide plate 70. The reflective pattern may include a predetermined pattern, e.g., the reflective pattern or/and prism pattern to reflect or/and irregularly reflect incident light. Thus, the light may be uniformly irradiated through the entire surface of the light guide plate 70. The reflective pattern may be disposed on the bottom surface of the light guide plate 70, and the prism pattern may be disposed on the top surface of the light guide plate 70. A disperser may be added into the light guide plate 70, but is not limited thereto.

The reflective member 45 may be disposed under the light guide plate 70. The reflective member 45 may reflect light traveling into a lower side of the light guide plate 70 to the display panel. In the backlight unit 20, the light leaking into the lower side of the light guide plate 70 may be incident again into the light guide plate 70 by the reflective member 45 to prevent light efficiency and light characteristics from being deteriorated and prevent a dark region from occurring. For example, the reflective member 45 may be formed of one of PET, PC, and PVC resins, but is not limited thereto. The reflective member 45 may be a reflective layer disposed on a top surface of the bottom cover 40, but is not limited thereto.

The bottom cover 40 may include a receiving part 41 with an upper side opened. The receiving part 41 may receive the light emitting module 30, the optical sheet 60, the light guide plate 70, and the reflective member 45. The bottom cover 40 may be formed of a metal having high heat dissipation efficiency, e.g., one of aluminum (Al), magnesium (Mg), zinc (Zn), titanium (Ti), tantalum (Ta), hafnium (Hf), niobium (Nb), and alloys thereof.

The reflective member 45, the light guide plate 70, and the optical sheet 60 may be successively stacked in the receiving part 41 of the bottom cover 40. The light emitting module 30 may be disposed on the first side surface 42 of the bottom cover 40 to correspond to one side surface of the light guide plate 70.

A recessed part 41B is defined in a bottom part 41A of the bottom cover 40. The recessed part 41B is a portion to which the second frame part 36-2 of the heatsink plate 36 is coupled. The recessed part 41B may have a depth similar to a thickness of the second frame part 36-2 and a width similar to that of the second frame part 36-2, but are not limited thereto.

Although the recessed part 41B is defined at a portion which is folded from the first side surface 42 of the bottom part 41A of the bottom cover 40 in the current embodiment, the recessed part 41B may not be defined in the bottom part 41A.

Figure 3:
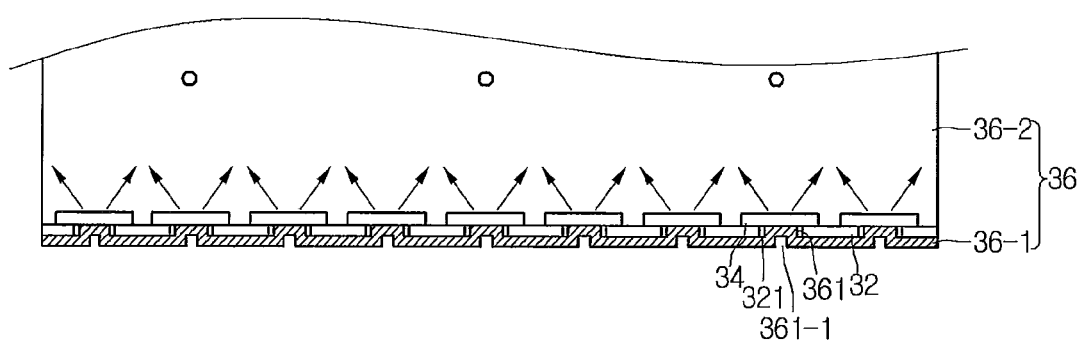
FIG. 3 is a side-sectional view illustrating a light emitting module of FIG. 1.

Referring to FIGS. 2 and 3, the second frame part 36-2 of the heatsink plate 36 may adhere to the recessed part 41B disposed defined in the bottom part of the bottom cover 40 through an adhesion member 52.

The first frame part 36-1 of the heatsink plate 36 may include a plurality of protrusions 361. The plurality of protrusions 361 protrude from the first frame part 36-1 along a direction of the light guide plate or the light emitting device. The protrusions 361 of the first frame part 36-1 correspond to the light emitting devices 34, respectively. The protrusions 361 of the first frame part 36-1 may have the same number as that of the light emitting devices 34. For another example, when each of the protrusions 361 of the first frame part 36-1 corresponds to two or three light emitting devices 34, the number of protrusions 361 of the first frame part 36-1 may be less than that of light emitting devices 34. Here, each of the protrusions 361 may be formed of the same material as the heatsink plate 36 or may adhere to a separate heatsink plate 36. Each of the protrusions 361 may be formed of the same material as the heatsink plate 36 or a material different from that of the heatsink plate 36.

A recess 361-1 may be defined in an area of the first frame part 36-1 corresponding to the protrusion 361. For example, the recess 361-1 may be defined by a punching process. Here, the protrusion 361 of the first frame part 36-1 may have a curved edge by the punching process. Also, the protrusion 361 may have a top surface having a flat area greater than about 50% of the entire top surface.

A plurality of protrusion holes 321 are defined in the module board 32. Centers of the plurality of protrusion holes 321 may be disposed on the same line. Also, the protrusions 361 of the first frame part 36-1 of the heatsink plate 36 may correspond to the plurality of protrusion holes 321, respectively. The protrusions 361 of the first frame part 36-1 are injected into the protrusion holes 321, respectively. Here, each of the protrusions 361 of the first frame part 36-1 may protrude by the same height as a thickness of the module board 32 or protrude with a height greater or less than a thickness of the module board 32. Here, the protrusion 361 of the first frame part 36-1 or/and the module board 32 may have a thickness of about 300 μm or more, for example, a thickness of about 400 μm±50 μm.

The protrusion 361 of the first frame part 36-1 and the protrusion hole 321 of the module board 32 may have a polygonal shape, a circular shape, or a hemisphere shape, but is not limited thereto. Also, the plurality of protrusions 361 may be disposed in the protrusion holes 321 defined under the light emitting devices 34, respectively, but is not limited thereto.

The module board 32 may be spaced from the second frame part 36-2 of the heatsink plate 36, but is not limited thereto.

Figure 4:
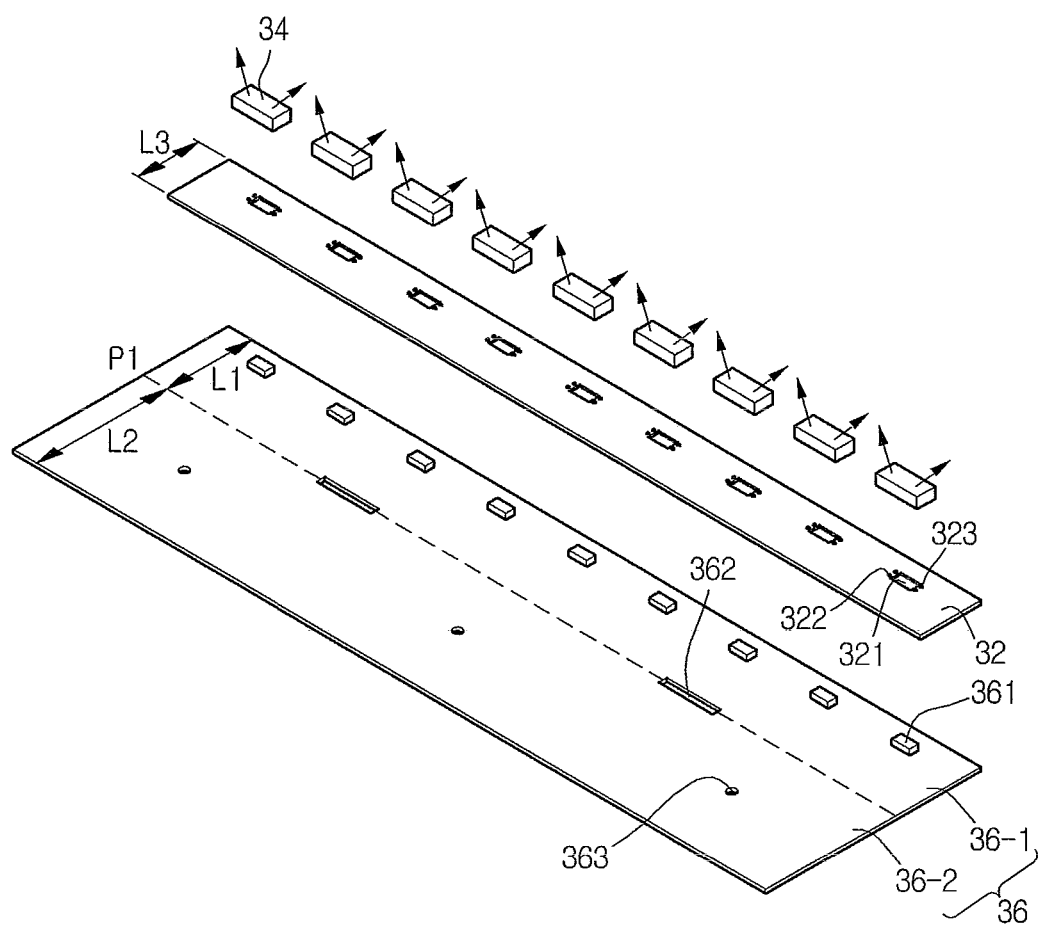
FIGS. 4 and 5 are views illustrating a process of manufacturing the light emitting module of FIG. 1.
Figure 5:
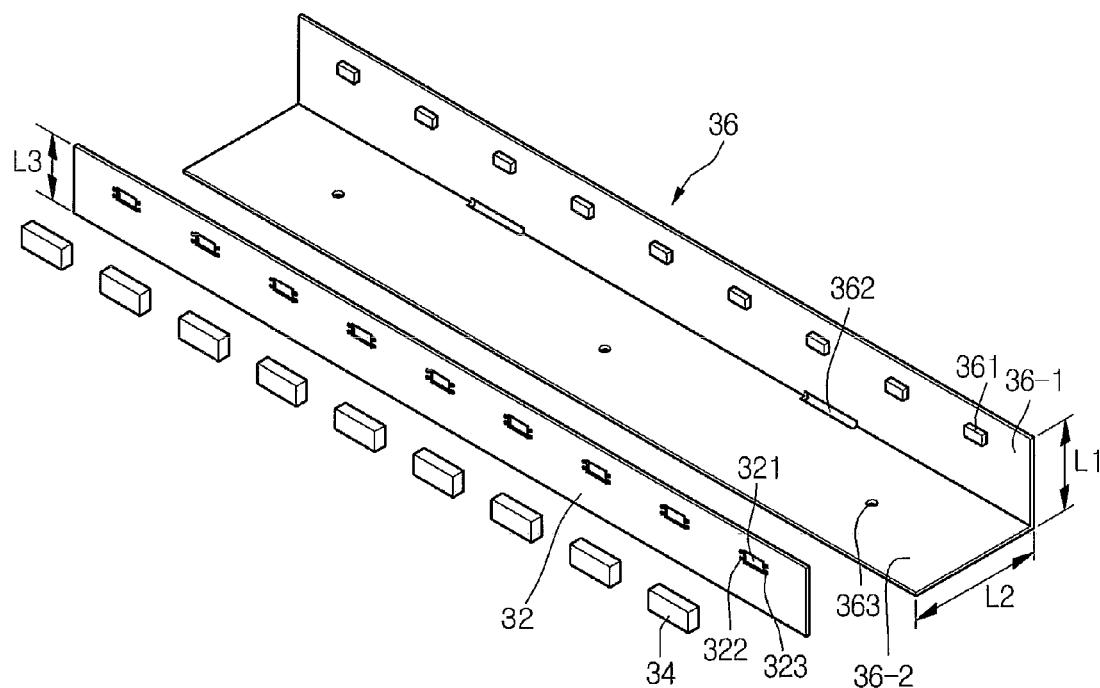

Referring to FIGS. 4 and 5, the second frame part 36-2 of the heatsink plate 36 may have a width L2 wider than that L3 of the module board 32. For example, the second frame part 36-2 may have a width of about 5 mm or more, for example, a width of about 6 mm to about 20 mm.

The heatsink plate 36 may have a length greater than that of the module board 32. Here, the heatsink plate 36 and the module board 32 may have lengths corresponding to an X-axis direction of FIG. 1, i.e., an arrangement direction of the light emitting devices 34. The width L3 of the module board 32 may be a length corresponding to the Y-axis direction of FIG. 1 or a thickness direction of the light guide plate.

An upper end of the first frame part 36-1 may be flush with an end of the module board 32 or disposed at a height greater than that of an end of the module board 32.

As shown in FIG. 4, the plurality of protrusion holes 321 are arranged in the module board 32. Also, the plurality of protrusion holes 321 correspond to the protrusions 361, respectively.

A first pad 322 and a second pad 323 which are disposed adjacent to the protrusion hole 321 are disposed on a first surface of the module board 32. Each of the first and second pads 322 and 323 may be formed as one pattern or plurality of patterns, but is not limited thereto. The first and second pads 322 and 323 may be disposed on both sides of the protrusion hole 321, for example, left and right sides or upper and lower sides of the protrusion hole 321. A space between the first pad 322 and the second pad 323 may be defined within a region of the light emitting device 34, but is not limited thereto.

In the heatsink plate 36, when the first frame part 36-1 is folded to the second frame part 36-2 along a boundary line P1 between the first frame part 36-1 and the second frame part 36-2, the first frame part 36-1 is folded from the second frame part 36-2 as shown in FIG. 5.

The plurality of protrusions 361 may be arranged on the first frame part 36-1. Also, the plurality of protrusions 361 may be disposed on the same center line as each other.

Here, to fold the heatsink plate 36, a hole 362 may be defined in the boundary line P1 between the first frame part 36-1 and the second frame part 36-2. The hole 362 may be provided in one or plurality. Also, a coupling hole 363 may be defined in at least one of the first and second frame parts 36-1 and 36-2, for example, the second frame part 36-2. A coupling member may be coupled to the bottom cover 40 or other mechanism through the coupling hole 363. Thus, the heatsink plate 36 may be fixed to the bottom cover 40. The coupling member may include a screw or a rivet, but is not limited thereto.

Referring to FIG. 5, the first frame part 36-1 and the second frame part 36-2 may have the same width L1 and L2. Alternatively, the second frame part 36-2 may have a width L2 wider than that L1 of the first frame part 36-1. The first frame part 36-1 may have the width L1 wider than that L3 of the module board 32.

A mounted structure of the light emitting device will be described with reference to FIGS. 6 and 7.

Figure 6:
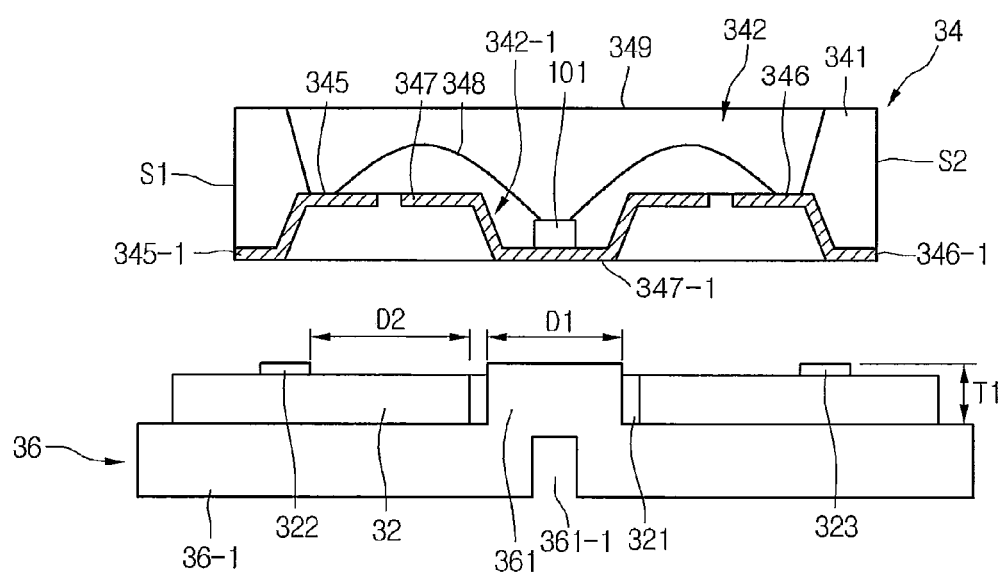
FIG. 6 is a side-sectional view illustrating a module board and a light emitting device of the light emitting module of FIG. 1.
Figure 7:
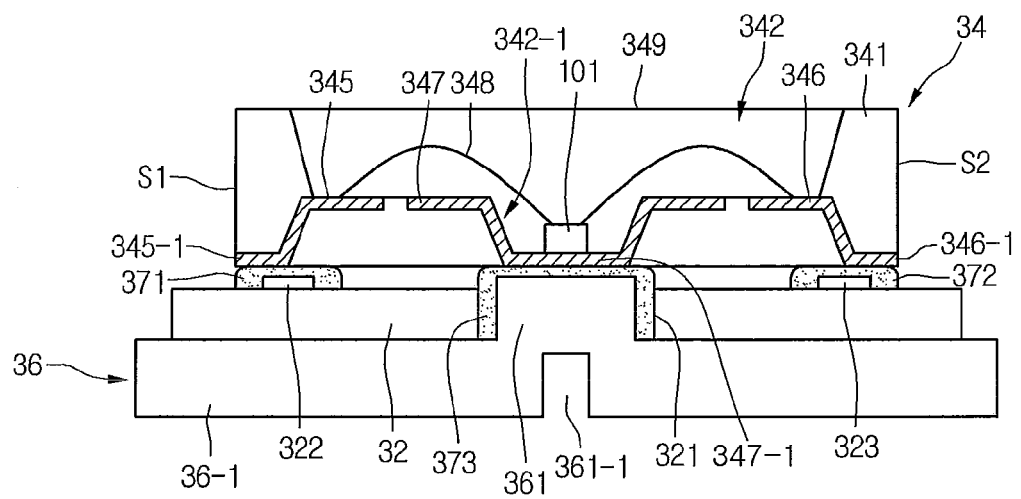
FIG. 7 is a side-sectional view illustrating an example of a structure in which the light emitting device is coupled to the module board of FIG. 6.

Referring to FIGS. 6 and 7, a light emitting device 34 includes a body 341 having a first cavity 342, first and second lead frames 345 and 346 disposed within the body 341, a heatsink frame 347 having a second cavity 342-1, a light emitting chip 101, a connection member 348, and a molding member 349.

The body 341 may be formed of at least one of a resin material such as polyphthalamide (PPA), silicon, a metal material, photo sensitive glass (PSG), sapphire ($Al_2O_3$), and a printed circuit board (PCB). The body 341 may be formed of a resin material such as polyphthalamide (PPA), silicon, or epoxy.

A top surface of the body 341 may have various shapes such as a triangular shape, a square shape, a polygonal shape, and a circular shape according to a use and design of the light emitting device 34. The first and second lead frames 345 and 346 may be disposed on a bottom of the body 341 and mounted on the board in a top view type. Alternatively, the first and second lead frames 345 and 346 may be disposed on a side surface of the body 341 and mounted on the board in a side view type, but is not limited there to.

The body 341 has the first cavity 342 which has an opened upper side, a side surface, and a bottom surface. The first cavity 342 may have a cup structure recessed from the top surface of the body 341 or a recessed structure, but is not limited thereto. The first cavity 342 may have the side surface perpendicular or inclined with respect to the bottom surface thereof.

The first cavity 342 may have a circular shape, an oval shape, or a polygonal shape when viewed from an upper side. The first cavity 342 may have a curved or flat edge.

The first lead frame 345 may be disposed in a first area of the bottom surface of the first cavity 342, and the second lead frame 346 may be disposed in a second area of the bottom surface of the first cavity 342. The first and second frames 345 and 346 may be spaced from each other within the first cavity 342. The heatsink frame 347 is disposed between the first and second frames 345 and 346.

A first lead part 345-1 of the first lead frame 345 is folded from the first lead frame 345 and disposed in a first area of the bottom surface of the body 341. The first lead part 345-1 may further protrude from a first side surface S1 of the body 341, but is not limited thereto.

A second lead part 346-1 of the second lead frame 346 is folded from the second lead frame 346 and disposed in a second area of the bottom surface of the body 341. The second lead part 346-1 may further protrude from a second side surface S2 opposite to the first side surface S1, but is not limited thereto.

Bottom surfaces of the first lead part 345-1 of the first lead frame 345 and the second lead part 346-1 of the second lead frame 346 may be flush with that of the body 341.

The heatsink frame 347 includes the second cavity 342-1. The second cavity 342-1 is defined in a central portion of the heatsink frame 347. The second cavity 342-1 may have a depth less than that of the bottom surface of the first cavity 342. Also, the second cavity 342-1 may have a recessed structure or a cup structure. A side surface of the second cavity 342-1 may be inclinedly or vertically folded from a bottom surface thereof. The bottom surface of the second cavity 342-1 may have a rectangular shape, a square shape, or circular or oval shape having a curved surface. Two side surfaces facing each other of side surfaces of the second cavity 342-1 may be inclined at the same angle or inclined at angles different from each other.

A portion of the heatsink frame 347 may be disposed on the bottom surface of the first cavity 342. A third lead part 347-1 of the heatsink plate 347 may be disposed on a lower portion of the body 341 and exposed to the bottom surface of the body 341.

Each of the first lead frame 345, the second lead frame 346, and the heatsink frame 347 may be formed of a metal material, e.g., at least one of Ti, Cu, Ni, Au, Cr, Ta, Pt, Sn, Ag, and P. Also, each of the first lead frame 345, the second lead frame 346, and the heatsink frame 347 may be provided as a single or multi layer. The first and second lead frames 345 and 346 and the heatsink frame 347 may have the same thickness or thicknesses different from each other, but is not limited thereto.

The other metal frame except for the first and second lead frames 345 and 346 and the heatsink frame 347 may be further disposed within the body 341 to serve as a heatsink frame or an intermediate connection terminal.

At least one light emitting chip 101 may be disposed within the second cavity 342-1 of the heatsink frame 347. The light emitting chip 101 may be disposed on the bottom surface of the second cavity 342-1 of the heatsink frame 347 and connected to the first and second lead frame 345 and 346 through the connection member 348. The connection member 348 includes a wire. The light emitting chip 101 may adhere to the bottom surface of the second cavity 342-1 using a thermal conductive adhesive or a solder.

The light emitting chip 101 may selectively emit light having a range from a visible light to an ultraviolet. For example, the light emitting chip 101 may include at least one of a red LED chip, a blue LED chip, a green LED chip, and a yellow green LED chip. The light emitting chip 101 may include a group III-V compound semiconductor light emitting device.

The molding member 349 may be disposed in at least one region of the first and second cavities 342 and 342-1 of the body 341. The molding member 349 may include a light-transmitting resin layer formed of silicon or epoxy and be provided as a single or multi layer. A phosphor for changing a wavelength of emitted light may be disposed on the molding member 349 or the light emitting chip 101. The phosphor may excite a portion of the light emitted from the light emitting chip 101 to emit light having a different wavelength. The phosphor may include one of YAG, TAG, silicate, nitride, and oxy-nitride-based material. The phosphor may include at least one of a red phosphor, a yellow phosphor, and a green phosphor, but is not limited thereto. A surface of the molding member 349 may have a flat shape, a concave shape, or a convex shape, but is not limited thereto.

A lens may be further disposed on the body 341. The lens may have a concave or/and convex lens structure. Also, the lens may adjust light distribution of the light emitted from the light emitting device 34.

Also, a protection device may be disposed within the light emitting device 34. The protection device may be disposed within the bottom surface of the first cavity 342. The protection device may be realized using a thyristor, a Zener diode, or transient voltage suppression (TVS). The protection device may protect the light emitting chip 101 from an electro static discharge (ESD).

Referring again to FIG. 6, the module board 32 may have a thickness T1 equal to or different from a height of the protrusion 361 of the first frame part 36-1. For example, a top surface of the protrusion 361 may protrude from a top surface of the module board 32 by a height different of about ±50 μm with respect to the top surface of the module board 32.

The protrusion 361 of the first frame part 36-1 may have a width D1 equal to or less or wider than that of the third lead part 347-1 exposed to the body 341 of the bottom surface of the heatsink frame 347. The top surface of the protrusion 361 may have an area equal to that of the third lead part 347-1 exposed to the body 341 of the bottom surface of the heatsink frame 347 or greater than about 60% of an area of the bottom surface of the third lead part 347-1 exposed to the bottom surface of the body of the bottom surface of the heatsink frame 347. The protrusion 361 and the third lead part 347-1 may indirectly contact each other through the solder or/and directly contact each other after the solder is removed.

The first and second pads 322 and 323 disposed on the module board 32 may be spaced from the protrusion hole 321. A distance D2 between the protrusion hole 321 and the first pad 322 may be at least 180 μm or more, for example, about 200 μm or more.

A tolerance between the protrusion hole 321 of the module board 32 and the protrusion 361 of the first frame part 36-1 may be about 1 μm or more, for example, range from about 20 μm to about 50 μm.

When the protrusion hole 321 of the module board 32 is coupled to the protrusion 361 of the first frame part 36-1, the module board 32 may be disposed on the first frame part 36-1. It may be unnecessary to provide a separate adhesive between the module board 32 and the first frame part 36-1. If necessary, an adhesion member may be provided.

Referring to FIG. 7, the first lead part 345-1 of the light emitting device 34 is bonded to the first pad 322 of the module board 32 using a first bonding member 371. The second lead part 346-1 is bonded to the second pad 323 of the module board 32 using a second bonding member 372. The third lead part 347-1 of the heatsink frame 347 is bonded to the protrusion 361 of the first frame part 36-1 using a third bonding member 373. The first to third bonding members 371, 372, and 373 may include a conductive material, e.g., a solder material. For another example, the first to third bonding members 371, 372, and 373 may include a conductive tape. Here, since the solder material has thermal conductivity greater than that of the conductive tape, the first to third bonding members 371, 372, and 373 may include the solder material.

Here, the third bonding member 373 may be inserted through the protrusion hole 321 of the module board 32 to contact side and top surfaces of the protrusion 361 of the first frame part 36-1. Thus, since the heatsink frame 347 of the light emitting device 34 is bonded to the protrusion 361 of the first frame part 36-1 through the third bonding member 373, it may be unnecessary to provide a separate bonding member for fixing the module board 32 to the first frame part 36-1.

The light emitting chip 101 may receive power from the first and second frames 345 and 346 to emit light. Also, heat generated from the light emitting chip 101 may be conducted into the heatsink frame 347 to primarily radiate the heat. Also, the heatsink frame 347 may directly conduct the heat into the protrusion 361 of the first frame part 36-1 to radiate the heat through the first frame part 36-1 and the heatsink plate 36 including the first frame part 36-1. Thus, since it may prevent a temperature of the light emitting chip 101 from being increased, the light emitting chip 101 may be stably operated, and also light efficiency of the light emitting device 34 may be improved.

Figure 8:
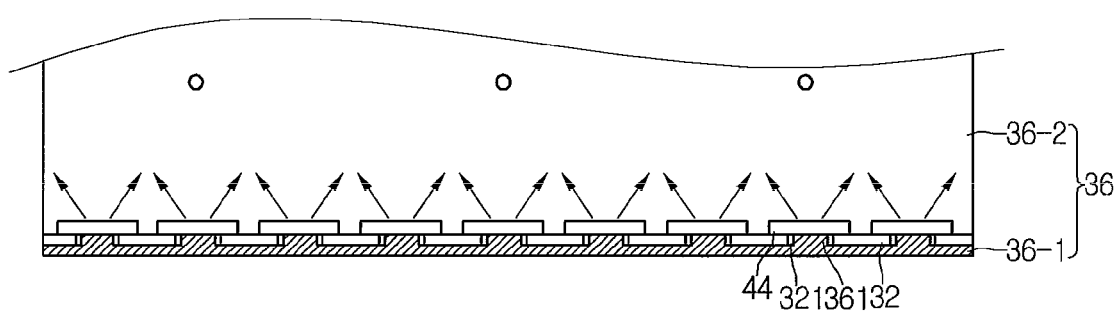
FIG. 8 is a view illustrating another example of a heatsink plate in the light emitting module of FIG. 3.
Figure 9:
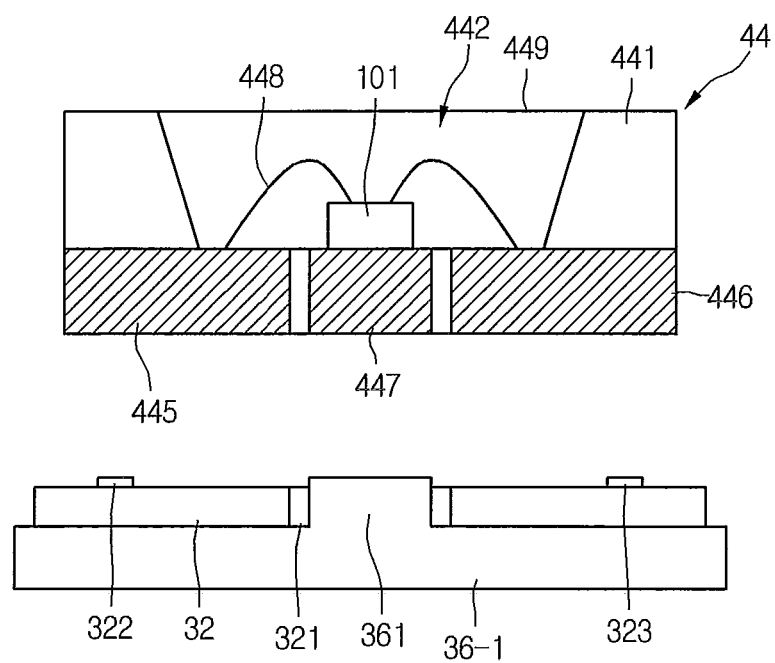
FIG. 9 is a view illustrating an example of coupling of the light emitting module of FIG. 8.

FIG. 8 is a view illustrating a modified example of the heatsink plate of FIG. 1. FIG. 9 is a view illustrating an example of coupling of the light emitting module of FIG. 8.

Referring to FIG. 8, a plurality of protrusions 361 may be disposed on a first frame part 36-1 of a heatsink plate 36. The plurality of protrusions 361 may be manufactured through an etching process, but the punching process. Thus, the recess as shown in FIG. 3 may be removed from the first frame 36-1.

Referring to FIG. 9, a light emitting device 44 includes a body having a first cavity 442, first and second lead frames 445 and 446 disposed within the body 441, a heatsink frame 447, a light emitting chip 101, connection members 448, and a molding member 449.

Bottom surface of the first and second lead frame 445 and 446 and the heatsink frame 447 which are disposed on a bottom surface of the body 441 may be flush with each other. The first and second lead frames 445 and 446 are connected to first and second pads 322 and 323 of the module board 32, respectively. The light emitting chip 101 is disposed on a top surface of the heatsink frame 447, and a protrusion 361 of the first frame part 36-1 is connected to the bottom surface of the heatsink frame 447.

The light emitting device 44 may be applied also to the first embodiment, but is not limited thereto.

Figure 10:
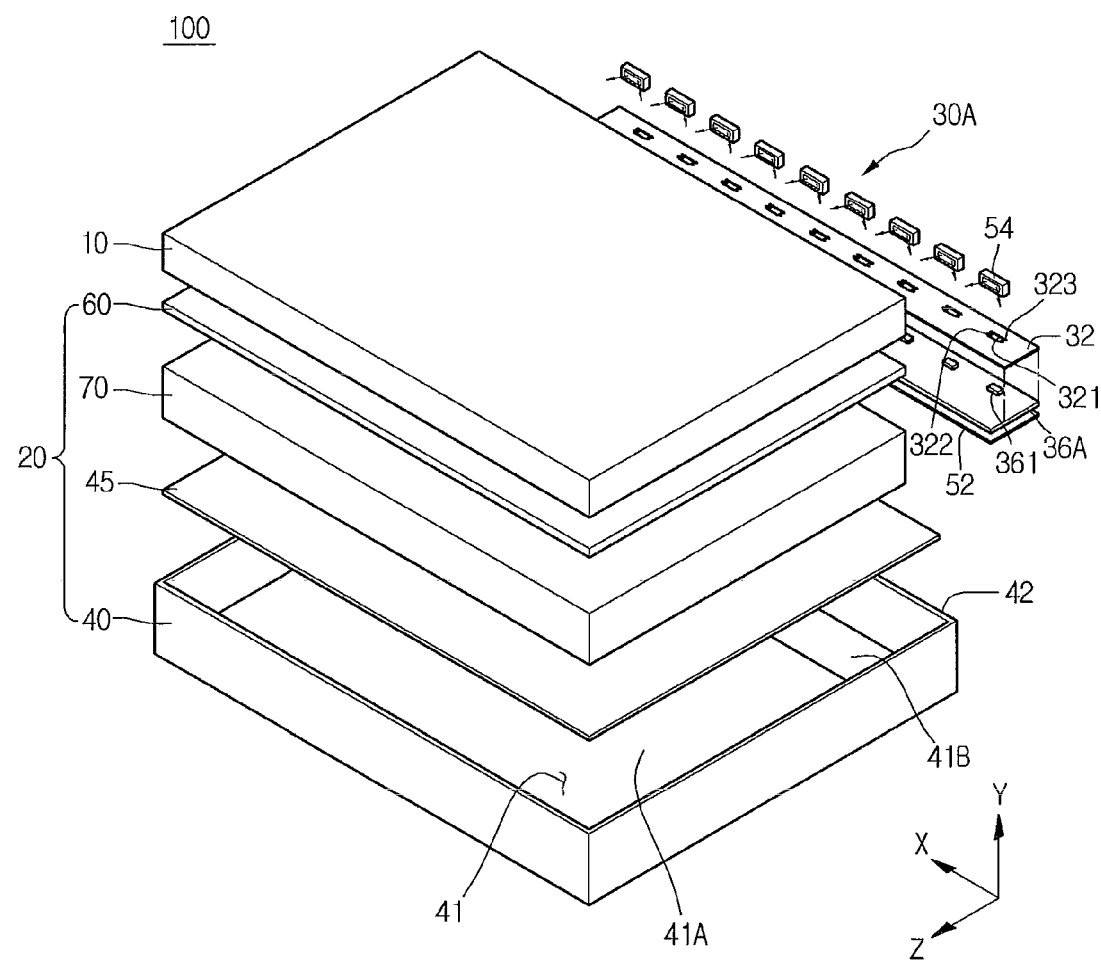
FIG. 10 is a view of a display device according to a second embodiment.

FIG. 10 illustrates a second embodiment. The same configuration as that of the first embodiment will be described with reference to the first embodiment.

Figure 11:
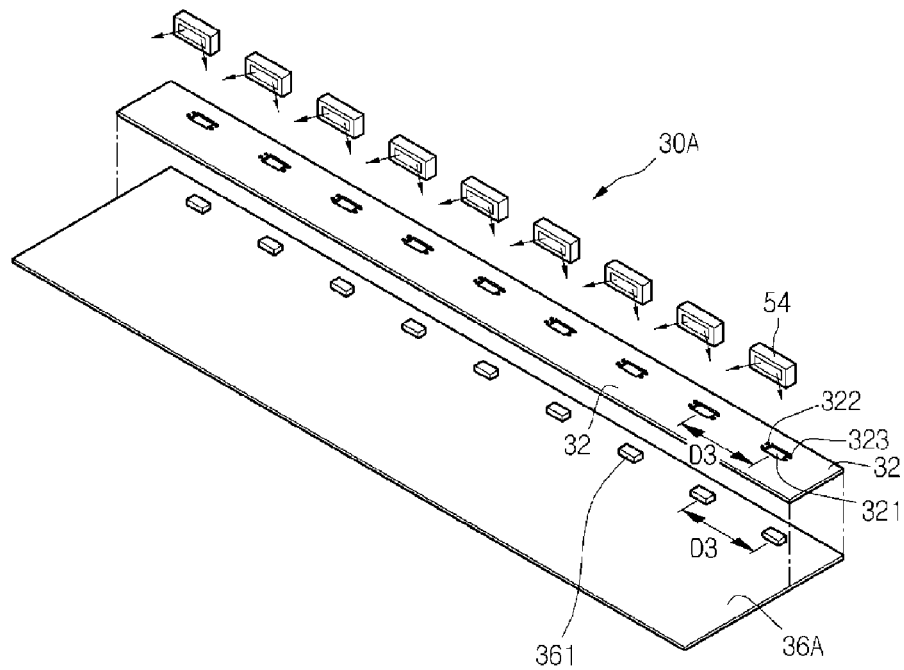
FIG. 11 is an exploded perspective view illustrating a light emitting module of FIG. 10.

Referring to FIGS. 10 and 11, a display device 100 includes a display panel 10 and a backlight unit 20. The backlight unit 20 includes a bottom cover 40, a light emitting module 30A, a reflective member 45, an optical sheet 60, and a light guide plate 70.

The light emitting module 30A includes a heatsink plate 36A, a module board 32, and a light emitting device 54. A plurality of protrusions 361 may be disposed on the heatsink plate 36A. A plurality of protrusion holes 321 may be defined in the module board 32. Also, the light emitting device 54 may be provided in plurality on the module board 32.

The heatsink plate 36A may have a flat plate shape without being folded.

In the light emitting device 54, a region in which the light emitting device 54 is mounted on the module board 32 may be perpendicular to a cavity region that is a light emission surface. That is, the light emitting device 54 may be mounted on first and second pads 322 and 332 of the module board 32 in a side view type.

Figure 12:
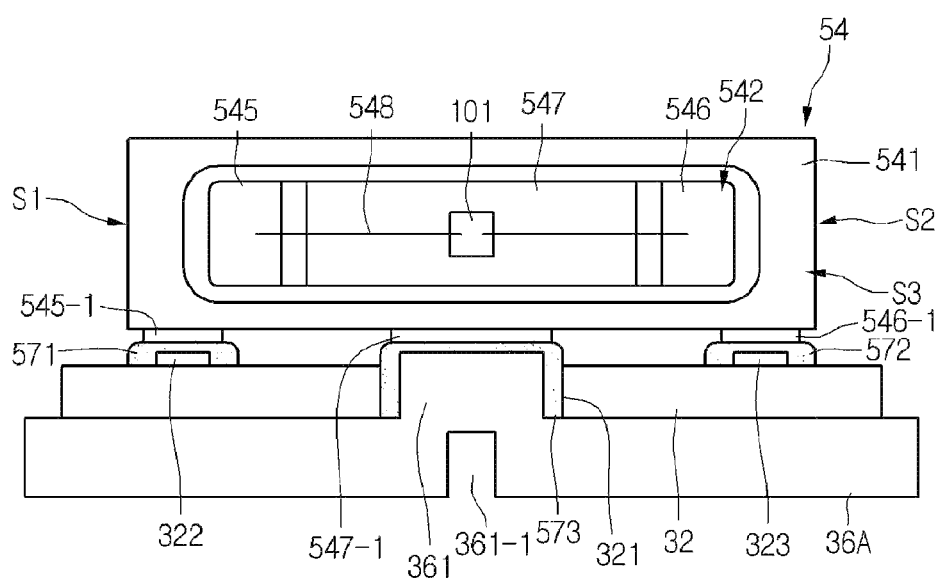
FIG. 12 is a sectional view illustrating an example of coupling of the light emitting module of FIG. 10.

Referring to FIG. 12, the light emitting device 54 includes a body 541, first and second lead frames 545 and 546 disposed within the body 541, a heatsink frame 547, a light emitting chip 101, a connection member 548, and a molding member.

The heatsink plate 36A may adhere to a recessed part 41B defined in a bottom surface of the module board 32 using an adhesion member 52 or be coupled to the recessed part 41B using a coupling member such as a screw.

In the body 541 of the light emitting device 54, a surface S3 in which the cavity 542 is defined may be disposed between a first side surface S1 and a second side surface S2. Also, the surface S3 may be nearly perpendicular to a surface on which first and second lead parts 545-1 and 546-1 are disposed.

The first lead part 545-1 of the first lead frame 545 is bonded to the first pad 322 of the module board 32 through a first bonding member 571. The second lead part 546-1 of the second lead frame 546 is bonded to the second pad 323 of the module board 32 through a second bonding member 572. The third lead part 547-1 of the heatsink frame 547 is bonded to the protrusion 361 of the heatsink plate 36A through a third bonding member 573.

Figure 13:
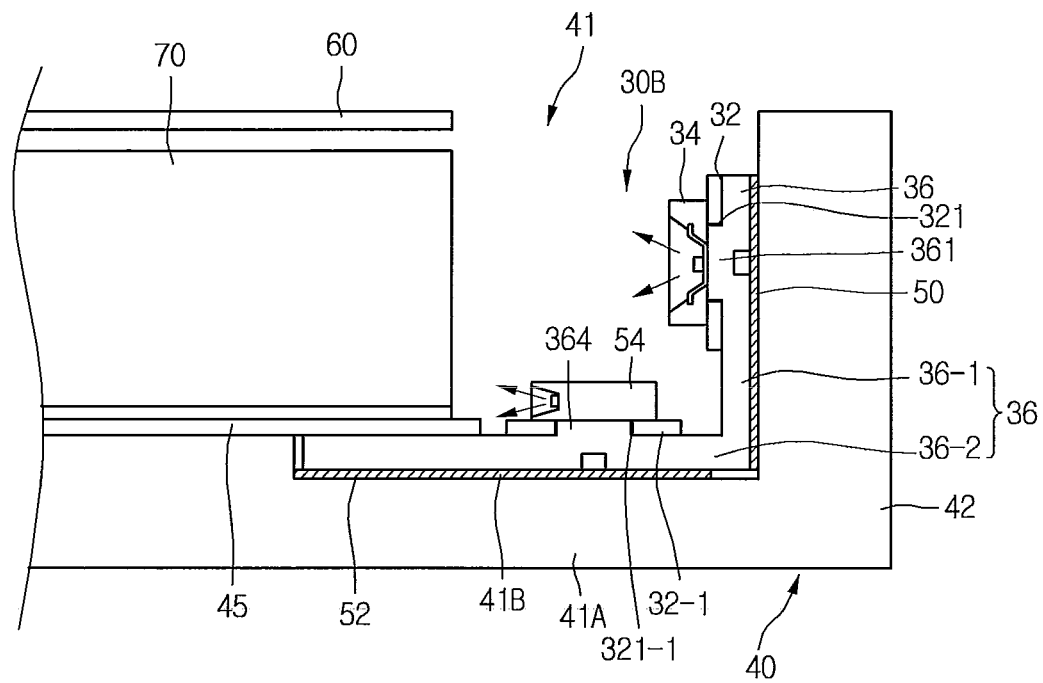
FIG. 13 is a side-sectional view of a backlight unit according to a third embodiment.

FIG. 13 is a view of a backlight unit according to a third embodiment.

Referring to FIG. 13, a light emitting module 30B includes first and second light emitting devices 34 and 54, first and second module boards 32 and 32-1, and a heatsink plate 36. The first module board 32 and the first light emitting device 34 may be applied to the module board and the light emitting device according to the first embodiment, and thus identified by the same reference numeral.

The heatsink plate 36 includes a first frame part 36-1 and a second frame part 36-2. A first module board 32 and the first light emitting device 34 are coupled to the first frame part 36-1. Also, the second module board 32-1 and the second light emitting device 54 are coupled to the second frame part 36-2.

The first and second light emitting devices 34 and 54 may be disposed on different areas of a light incident part of a light guide plate 70 to correspond to each other.

A protrusion 361 is disposed on the first frame part 36-1. The protrusion 361 is coupled to a protrusion hole 321 of the first module board 32. In the first light emitting device 34 disposed on the first module board 32, the heatsink frame 36 is connected to the protrusion 361 of the first frame part 36-1 to radiate heat.

A protrusion 364 is disposed on the second frame part 36-2. The protrusion 364 is coupled to a protrusion hole 321-1 of the second module board 32-1. In the second light emitting device 54 disposed on the second module board 32-1, the heatsink frame 547 is connected to the protrusion 364 of the second frame part 36-2 as shown in FIG. 12 to improve heat dissipation efficiency of the second light emitting device 54.

Here, in the light emitting module 30B, the top view type first light emitting device 34 may be selectively coupled to the light emitting devices of FIGS. 6 and 9. Also, the second light emitting device 54 may be selectively coupled to the light emitting device of FIG. 12.

Figure 14:
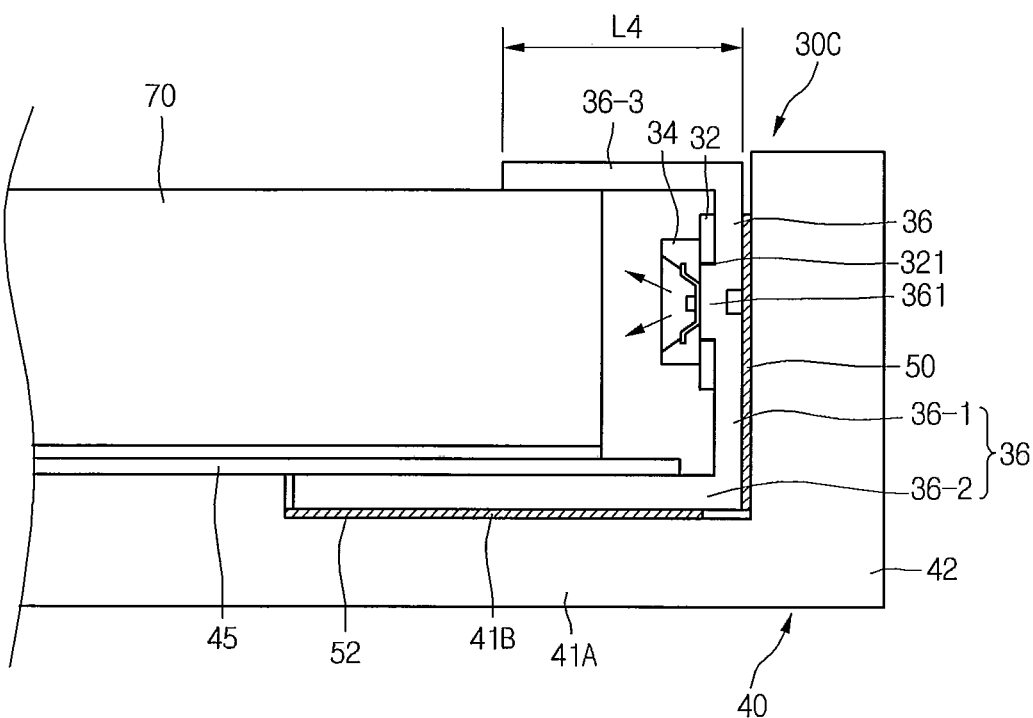
FIG. 14 is a side-sectional view of a backlight unit according to a fourth embodiment.

FIG. 14 is a view of a backlight unit according to a fourth embodiment.

Referring to FIG. 14, a light emitting module 30C includes a light emitting device 34, a module board 32, and a heatsink plate 36.

The heatsink plate 36 includes a first frame part 36-1 and second and third frame parts 36-2 and 36-3 facing each other.

The second and third frame parts 36-2 and 36-3 may be folded at an angle of about 800 to about 110° with respect to the first frame part 36-1. The second frame part 36-2 is disposed under the light guide plate 70, and the third frame part 36-3 is disposed on the light guide plate 70. A distance between the second frame part 36-2 and the third frame part 36-3 may be at least greater than a thickness of the light guide plate 70. The third frame part 36-3 may have a width L4 less than that of the second frame part 36-2, but is not limited thereto.

The third frame part 36-3 of the heatsink plate 36 may prevent light emitted from the light emitting device 34 from leaking.

Figure 15:
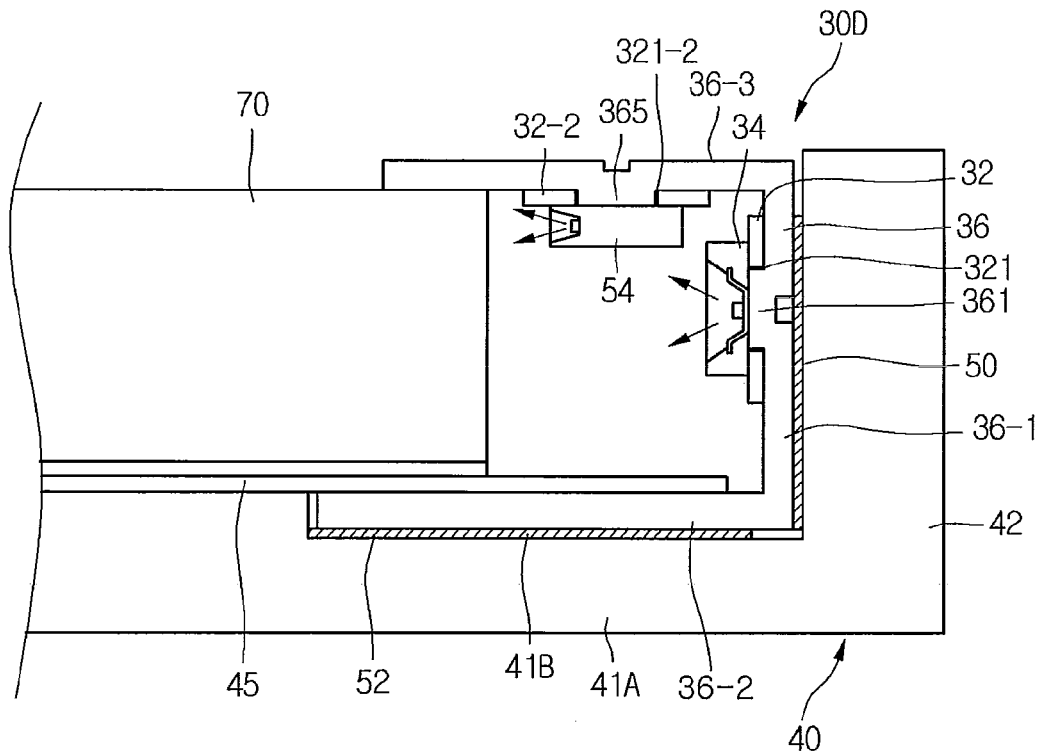
FIG. 15 is a side-sectional view of a backlight unit according to a fifth embodiment.

FIG. 15 is a view of a backlight unit according to a fifth embodiment.

Referring to FIG. 15, a light emitting module 30D includes first and second light emitting devices 34 and 54, first and second module boards 32 and 32-2, and a heatsink plate 36. The first module board 32 and the first light emitting device 34 may be applied to the module board and the light emitting device according to the first embodiment, and thus identified by the same reference numeral.

The heatsink plate 36 includes a first frame part 36-1 and second and third frame parts 36-2 and 36-3 facing each other. The second and third frame parts 36-2 and 36-3 may be folded from the first frame part 36-1 at an angle of about 80° to about 110°. The second frame part 36-2 is disposed under the light guide plate 70, and a portion of the third frame part 36-3 is disposed on the light guide plate 70. A distance between the second frame part 36-2 and the third frame part 36-3 may be at least greater than a thickness of the light guide plate 70. The third frame part 36-3 may have a width less than that of the second frame part 36-2, but is not limited thereto.

The third frame part 36-3 of the heatsink plate 36 may prevent light emitted from the light emitting device 34 from leaking.

The second module board 32-2 is coupled to a lower portion of the third frame part 36-3, and a protrusion 365 of the third frame part 36-3 is inserted into a hole 321-2 of the second module board 32-2. The second light emitting device 54 is mounted on the second module board 32-2. As shown in FIG. 12, a heatsink frame may be connected to the protrusion 365 of the third frame part 36-3.

In the light emitting module 30D, the top view type first light emitting device 34 and the side view type second light emitting device 54 may be disposed on different areas of a light incident part to improve light efficiency.

Figure 16:
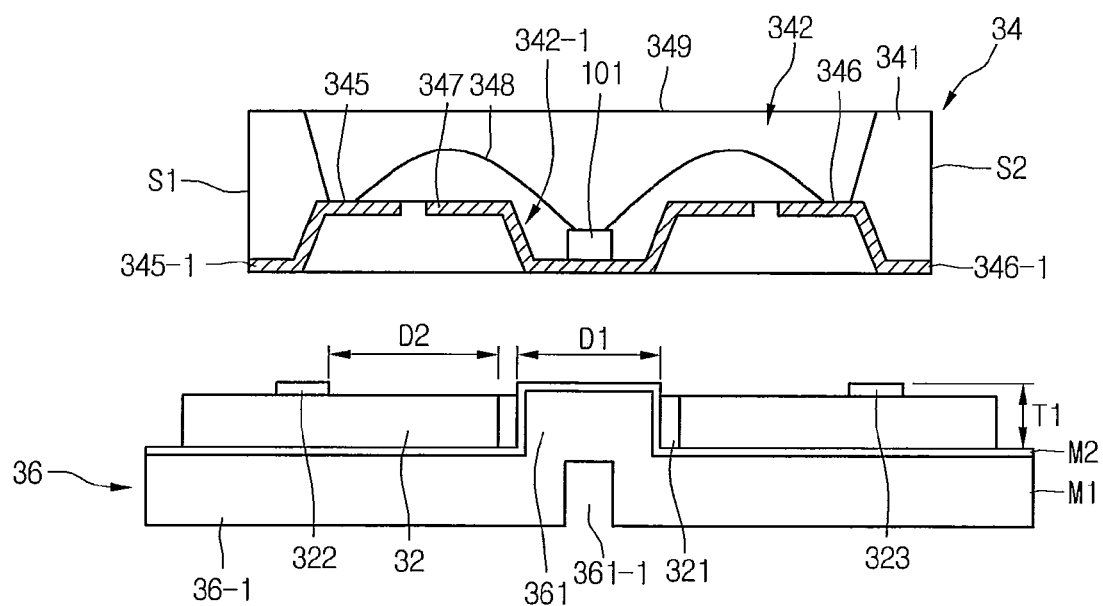
FIG. 16 is a side-sectional view illustrating a module board and a light emitting device of a light emitting module according to a sixth embodiment.

FIG. 16 is a side-sectional view illustrating a module board and a light emitting device of a light emitting module according to a sixth embodiment. In description of the sixth embodiment, the same part as that of the first embodiment will be identified by the same reference numeral and described with reference to the first embodiment.

Figure 17:
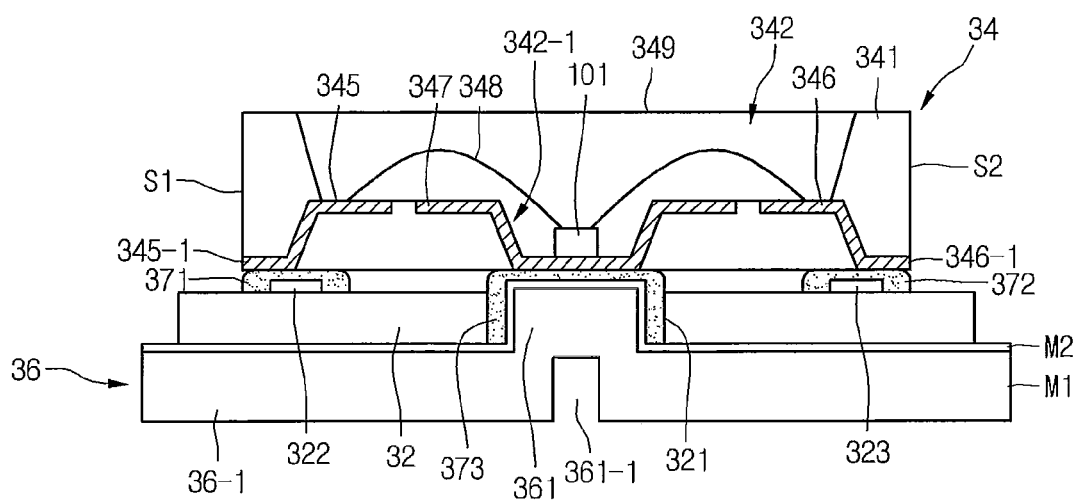
FIG. 17 is a side-sectional view illustrating an example of a structure in which the light emitting device is coupled to the module board of FIG. 16.

Referring to FIGS. 16 and 17, a light emitting module includes a heatsink plate 36 having a multi-layer structure, a module board 32 disposed on the heatsink plate 36, and a light emitting device 34 disposed on the module board 32 and connected to a protrusion 361 of the heatsink plate 36.

The heatsink plate 36 includes a plurality of metal layers M1 and M2. The plurality of metal layers M1 and M2 include a first metal layer M1 and a second metal layer M2 disposed on the first metal layer M1. For example, the first metal layer M1 may be formed of aluminum or an aluminum alloy having heat dissipation efficiency. The second metal layer M2 may include at least one plating layer. For example, the second metal layer M2 may be formed of at least one of Ni or/and a Ni alloy, W, and Mo, or alloys containing at least one thereof and provided as a single or multi layer. Also, the second metal layer M2 may be formed of a material reacting with the first metal layer M1, e.g., the Al material or plated with the Al material, e.g., Ni or/and a Ni alloy. The second metal layer M2 may be provided as a single or multi layer. Examples of the material of the second metal layer M2 may include a Ni—Ag alloy, a Ni—Au alloy, a Ni—Pd alloy, a Ni—Cu alloy, a Ni—Zn alloy, a Ni—W alloy, a Ni—Mo alloy, and a Ni—W—Mo alloy as a single or multi layer. The Ni—W—Mo alloy of the Ni alloys may well adhere to a solder when compared to other alloys, but is not limited thereto. The second metal layer M2 may be formed by plating an organic solder, e.g., through organic solderability preservatives (OSP). That is, since an organic material may be coated on a surface of the first metal layer M1, the OSP may be referred to as a pre-flux processing process. Also, after Ni is plated, Cu may be plated. Thus, this plating process may prevent the surface of the first metal layer M1 from being oxidized.

In the current embodiment, an oxide layer formed on a surface of the first metal layer M1 may be removed using a nitric acid or/and a hydrofluoric acid, and then the second metal layer M2 may be plated or coated on the surface of the first metal layer M1.

The second metal layer M2 may be disposed on a top surface of the heatsink plate 36. Alternatively, the second metal layer M2 may be disposed on top and bottom surface or a portion of the top surface of the heatsink plate 36. Also, the second metal layer M2 may be disposed on an area corresponding to a surface opposite to a surface on which a pad is disposed on the module board 32 among surfaces of the heatsink plate 36, i.e., a top surface of the first frame part 36-1.

The heatsink plate 36 may have a thickness of about 0.5 mm or more, for example, a thickness of about 0.6 mm to about 1 mm. The first and second frame parts 36-1 and 36-2 may have the same thickness or thickness different from each other.

The second metal layer M2 having a thickness less by several times than that of the first metal layer M1 may be disposed on the surface of the heatsink plate. The first metal layer M1 may have a thickness of about 0.6 mm to about 1 mm, and the second metal layer M2 may have a thickness of about 3 μm to about 4 μm.

Since the second metal layer M2 may be well coupled to a third bonding member 373 than the Al material, it may prevent the third bonding member 373 from being separated from the second metal layer M2. Here, the second metal layer M2 may be formed using a plating layer, e.g., electroless plating. The second metal layer M2 may be disposed on surfaces of the first frame part 36-1 and a second frame part. Alternatively, the second metal layer M2 may be disposed on the surface of the first frame part 36-1 or a surface of the protrusion 361.

The third bonding member 373 is bonded between the heatsink frame 347 and the heatsink plate 36 including the second metal layer M2 that is a plating layer.

Since the second metal layer M2 is plated on the surface of the heatsink plate 36, it may prevent the third bonding member 373 such as a solder from coming off. Thus, reliability of the light emitting module may be improved.

When only the first metal layer M1 is used, since an oxide layer is treated on the surface of the heatsink plate 36, bonding properties with a material such as the solder may be reduced to allow the solder to come off, thereby reducing the heat dissipation efficiency. In the current embodiment, the oxide layer formed on the surface of the first metal layer M1 may be removed using the nitric acid or/and the hydrofluoric acid, and then the second metal layer M2 may be plated or coated on the surface of the first metal layer M1. Thus, the bonding properties with the bonding member such as the solder may be improved. Therefore, the heat dissipation efficiency may be improved.

For another example, the second metal layer M2 may be disposed on the surface of the protrusion 361 of the first frame part 36-1. That is, the second metal layer M2 may be disposed between the third bonding member 373 and the first meal layer M1 disposed on the protrusion 361. Thus, the second metal layer M2 may improve bonding efficiency with the third bonding member 373. Also, the first metal layer M1 may improve heat dissipation efficiency on an area on which the second metal layer M2 is not disposed.

The first frame part 36-1 of the heatsink plate 36 may adhere to a first side surface 42 of a bottom cover 40 through an adhesion member 50. The first frame part 36-1 of the heatsink plate 36 may be coupled using a coupling member, but the adhesion member.

Figure 18:
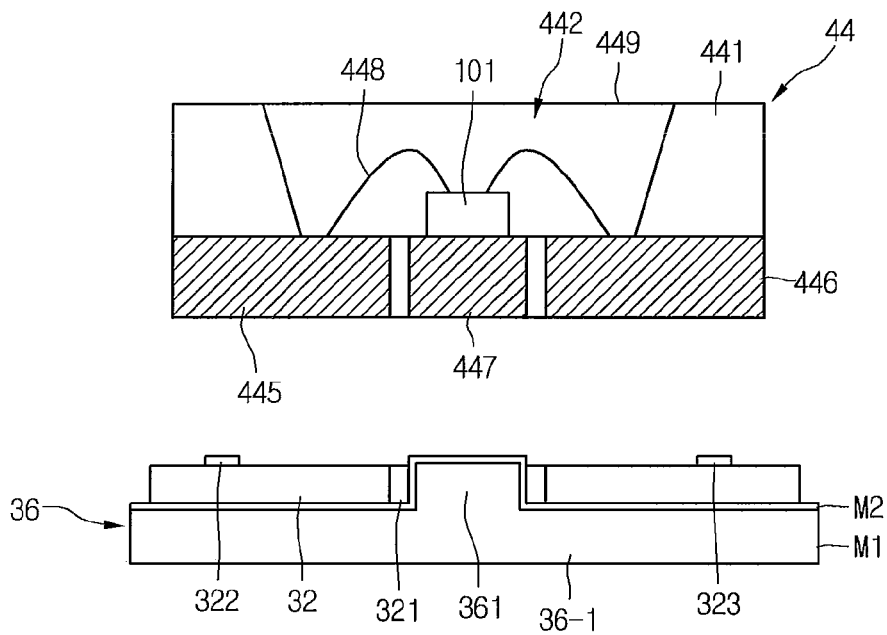
FIG. 18 is a side-sectional view of a light emitting module according to a seventh embodiment.

FIG. 18 is a side-sectional view of a light emitting module according to a seventh embodiment. In description of the seventh embodiment, the same part as that of FIG. 9 will be identified by the same reference numeral and described with reference to FIG. 9.

Referring to FIG. 18, a light emitting module includes a heatsink plate 36, a module board 32, and a light emitting device 44.

A plurality of protrusions 361 may be disposed on a first frame part 36-1 of the heatsink plate 36. The plurality of protrusions 361 may be manufactured by an etching process. The heatsink plate 36 includes a first metal layer M1 and a second metal layer M2. The first and second metal layers M1 and M2 will be described with reference to FIGS. 16 and 17.

In the light emitting device 44, bottom surfaces of a first lead frame 445, a second lead frame 446, and a heatsink frame 447 which are disposed on a bottom surface of a body 441 may be flush with each other. The first and second lead frames 445 and 446 are connected to first and second pads 322 and 323 of the module board 32, respectively. A light emitting chip 101 is disposed on a top surface of the heatsink frame 447, and a bottom surface of the light emitting frame 447 is disposed on a protrusion 361 of the first frame part 36-1. The light emitting device 44 may be applied also to the first embodiment, but is not limited thereto. The second metal layer M2 disposed on the protrusion 361 of the heatsink plate 36 may contact a bonding member such as a solder.

Figure 19:
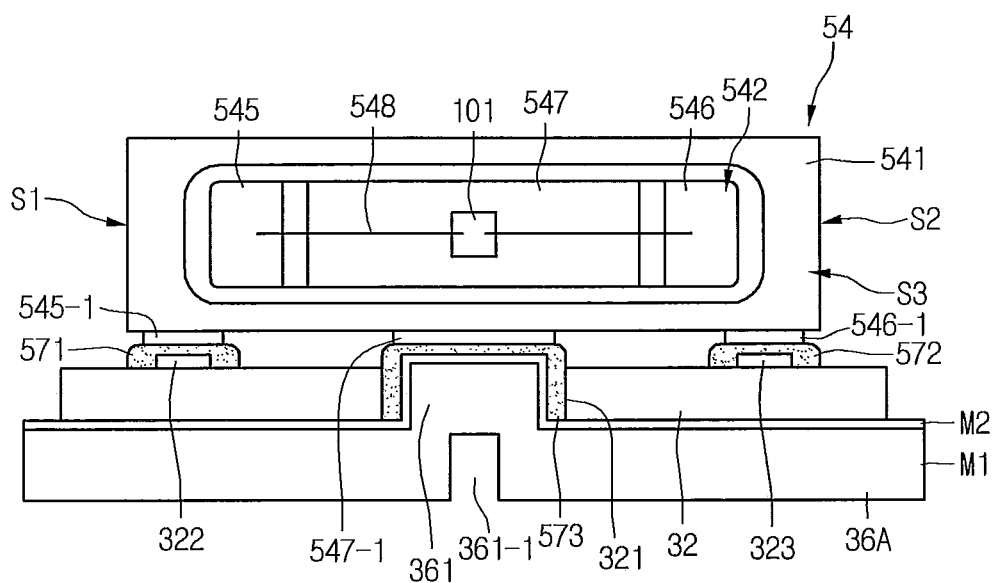
FIG. 19 is a side-sectional view of a light emitting module according to an eighth embodiment.

FIG. 19 is a side-sectional view of a light emitting module according to an eighth embodiment. In description of the eighth embodiment, the same part as that of FIG. 12 will be identified by the same reference numeral and described with reference to FIG. 12.

Referring to FIG. 19, a light emitting module includes a heatsink plate 36A, a module board 32, and a light emitting device 54.

In the light emitting device 54, a first lead part 545-1 of a first lead frame 545 is bonded to a first pad 322 of the module board 32 through a first bonding member 571. A second lead part 546-1 of a second lead frame 546 is bonded to a second pad 323 of the module board 32 through a second bonding member 572. A third lead part 547-1 of a heatsink frame 547 is bonded to a protrusion 361 of the heatsink plate 36A through a third bonding member 573. A second metal layer M2 disposed on the protrusion 361 of the heatsink plate 36A may contact the third bonding member 573 such as a solder.

Figure 20:
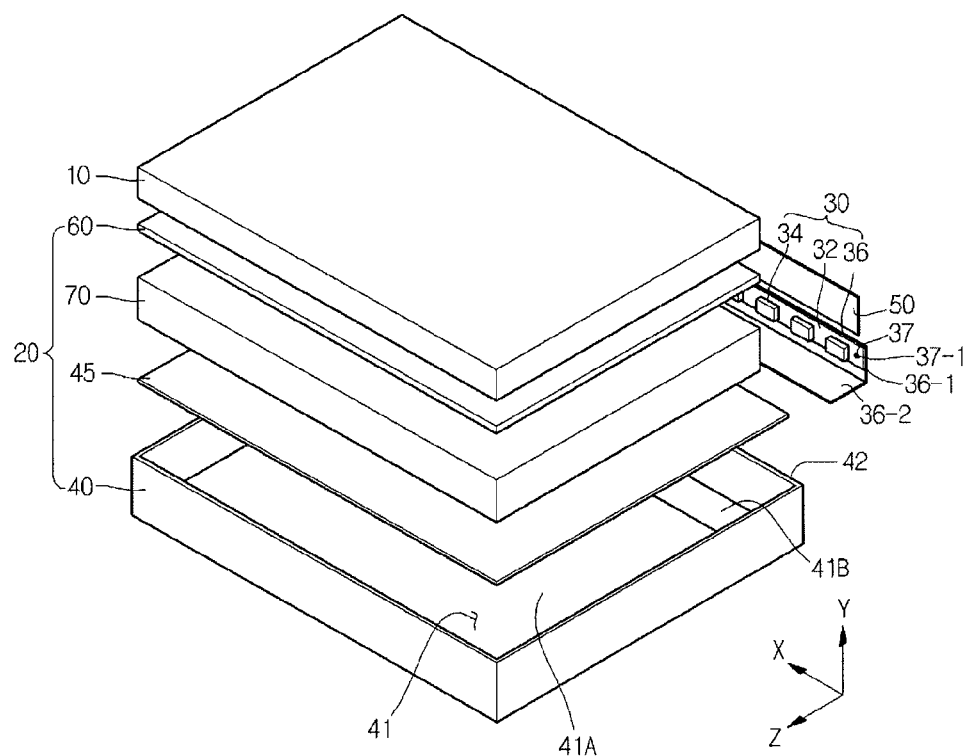
FIG. 20 is a perspective view of a display device including a backlight unit according to a ninth embodiment.
Figure 21:
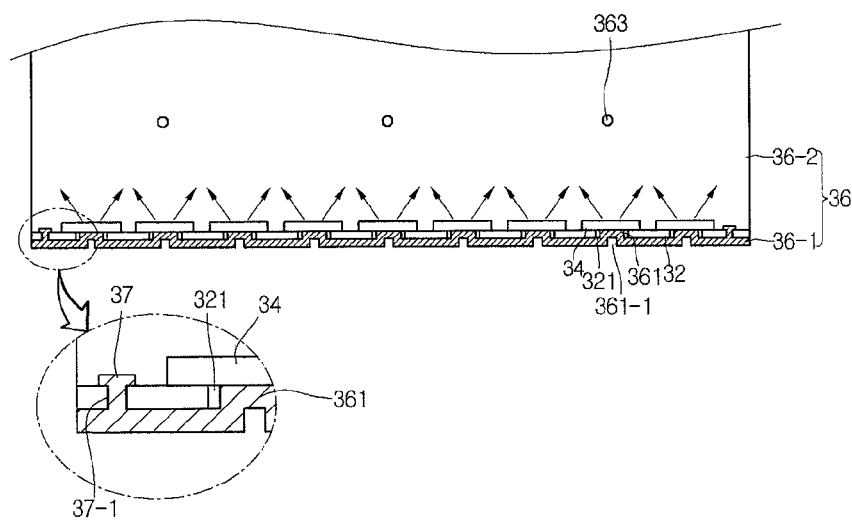
FIG. 21 is a side-sectional view illustrating a light emitting module of FIG. 20.
Figure 22:
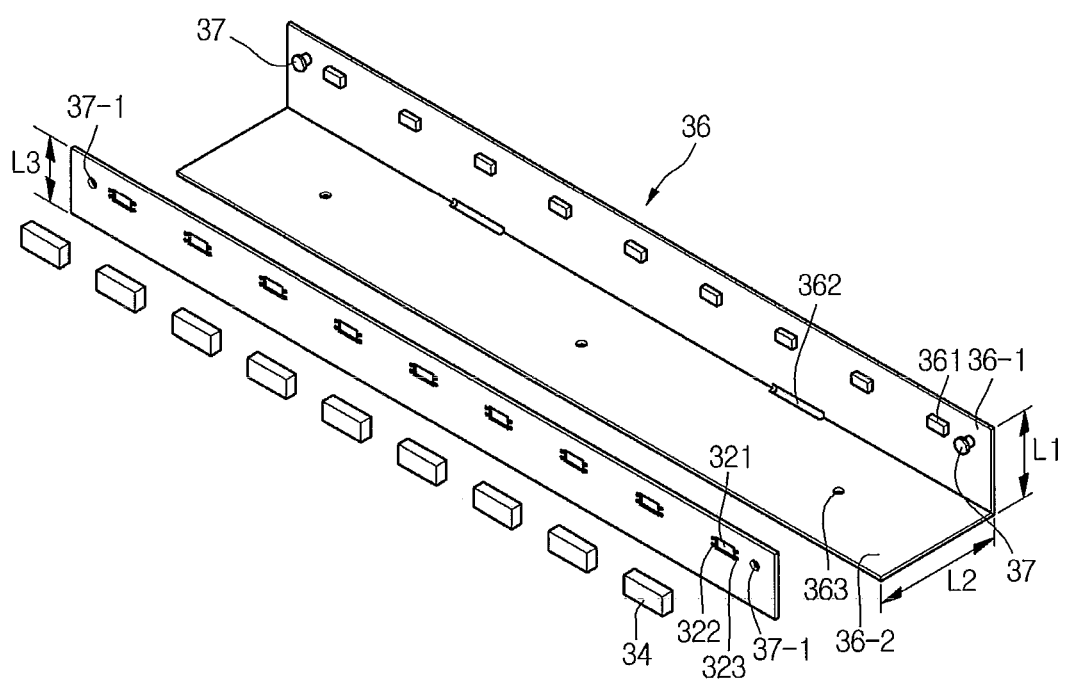
FIG. 22 is an exploded perspective view illustrating a light emitting module of FIG. 20.

FIG. 20 is a perspective view of a display device including a backlight unit according to a ninth embodiment. FIG. 21 is a side-sectional view illustrating a light emitting module of FIG. 20. FIG. 22 is an exploded perspective view illustrating a light emitting module of FIG. 20. In description of the ninth embodiment, the same part as that of the first embodiment will be described with reference to the first embodiment.

Referring to FIGS. 20 to 22, a display device include a display panel 10 on which an image is displayed and a backlight unit 20 providing light to the display panel 10. The backlight unit 20 includes a light guide plate 70 providing planar light onto the display panel 10, a reflective member 45 disposed under the light guide plate 70 to reflect leaking light, a light emitting module providing light onto at least one surface of the light guide plate 70, an optical sheet 60 disposed above the light guide plate 70, and a bottom cover 40 defining a lower outer appearance of the display device. The backlight unit 20 may omit at least one of the reflective member 45 and the optical sheet 60.

The module board 32 may have at least one coupling hole 37-1. When the coupling hole 37-1 is provided in plurality, the plurality of coupling holes 37-1 may be spaced from each other. The coupling hole 37-1 may be spaced from a plurality of holes 321. For example, the coupling holes 37-1 may be defined in sides of the outermost holes 321, respectively. A distance between the plurality of coupling holes 37-1 may be greater than that between the outermost holes 321. Also, the coupling hole 37-1 may be defined in a center area. The coupling hole 37-1 may have the same lower and upper widths or have an upper width less than a lower width.

The coupling hole 37-1 of the module board 32 may be disposed on a center of the module board 32 or the same center line as the hole 321. Alternatively, two coupling holes 37-1 may be disposed on upper and lower areas which get out of the center line of the module board 32, respectively.

A first frame part 36-1 of the heatsink plate 36 includes a coupling protrusion 37. The coupling protrusion 37 may be disposed on a position corresponding to that of the coupling hole 37-1 of the module board 32. The coupling protrusion 37 may protrude from a top surface of the heatsink plate 36. Here, the coupling protrusion 37 may protrude by a thickness of the module board 32 or a height greater than the thickness of the module board 32. The coupling protrusion 37 may have the same lower and upper widths or have an upper width wider than a lower width.

Each of the coupling hole 37-1 and the coupling protrusion 37 may have a circular shape, a polygonal shape, a shape having an angled surface, or a shape having a curved surface when viewed from an upper side. The coupling protrusion 37 may have a shape different from that of a first protrusion 361. A top surface of the coupling protrusion 37 may have an area less than that of a top surface of the protrusion 361. Also, the coupling protrusion 37 may have a height greater than that of the protrusion 361, as seen in FIG. 21.

The coupling protrusion 37 of the heatsink plate 36 is inserted into a coupling hole 37-1 of the module board 32. An upper end of the coupling protrusion 37 may be fitted into an upper end of the coupling hole 37-1 of the module board 32 or hung on a tops surface of the module board 32. Thus, it may prevent the module board 32 from being separated from the heatsink plate 36 or moved.

Here, a tolerance between the coupling hole 37-1 and the coupling protrusion 37 may be less than about 50 μm. The coupling due to a surface contact between the coupling protrusion 37 and the coupling hole 37-1 may be enhanced by the tolerance. Also, the coupling protrusion 37 may be inserted or separated due to the tolerance.

The coupling protrusion 37 and the coupling hole 37-1 may be disposed between a plurality of protrusions disposed on the first frame part 36-1, but is not limited thereto.

In the current embodiment, when the module board 32 is coupled to the heatsink plate 36, the protrusion 361 of the heatsink plate 36 is inserted into the hole 321 of the module board 32. Here, it may be unnecessary to provide a separate adhesion member between the module board 32 and the heatsink plate 36. In this case, since the coupling hole 37-1 of the module board 32 is coupled to the coupling protrusion 37 of the heatsink plate 36, the module board 32 may be primarily fixed to the heatsink plate 36. Thereafter, since the light emitting device 34 adheres to the protrusion 361 of the heatsink plate 36 on the module board 32, the module board 32 may be supported by the light emitting device 34 and secondarily fixed.

Figure 23:
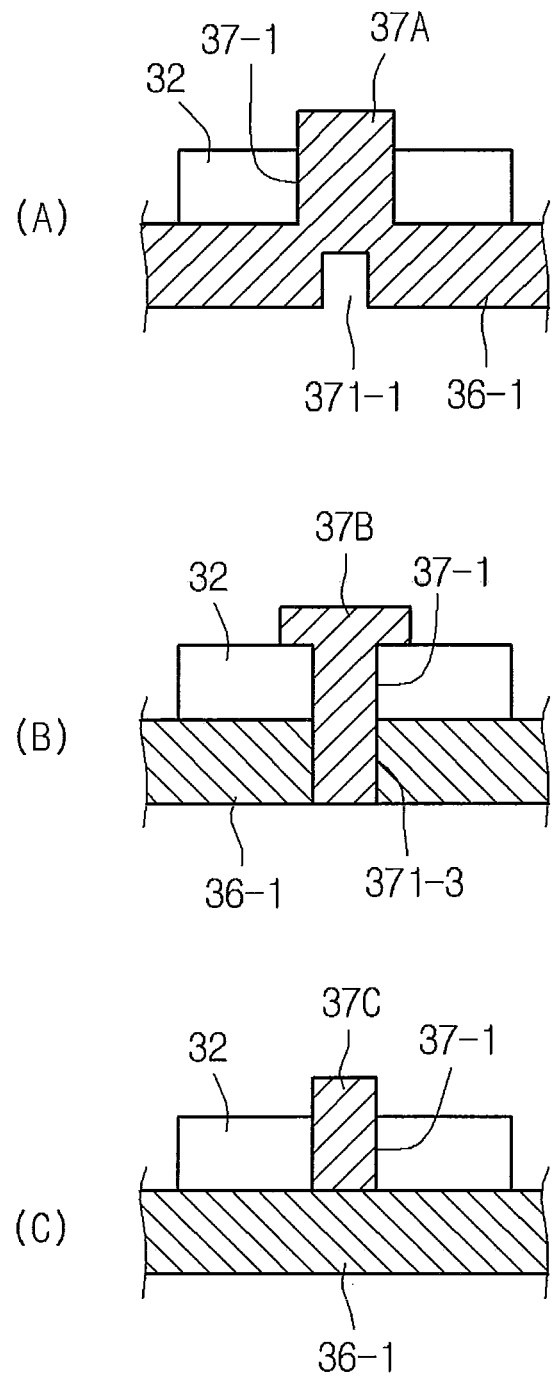
FIGS. 23A, 23B, and 23C are views illustrating another example of a second protrusion of a heatsink plate and a second hole of a module board according to a ninth embodiment.

FIGS. 23A, 23B, and 23C are views illustrating modified examples of a coupling protrusion and a coupling hole according to a ninth embodiment.

Referring to FIG. 23A, when a recess 371-1 is defined in a bottom surface of the first frame part 36-1 through a press punching process, a coupling protrusion 37A protruding toward a side opposite to the recess 371-1 is disposed on a top surface. The coupling protrusion 37A has a height greater than that of a module board 32. Here, the coupling protrusion 37A may have an upper area greater than that of a lower area thereto. Also, the coupling protrusion 37A may be forcibly inserted through the coupling hole 37-1 of the module board 32 and hung on an upper end of the module board 32. As a result, the coupling protrusion 37A may be coupled to the module board 32.

Referring to FIG. 23B, a coupling protrusion 37B is inserted through the coupling hole 37-1 of the module board 32 and coupled to a coupling hole 371-3 of the first frame part 36-1. Here, the coupling protrusion 37B may be a screw or rivet. The coupling hole 371-3 may have a screw line or a stepped structure.

Referring to FIG. 23C, a coupling protrusion 37c may adhere to a top surface of the first frame part 36-1 through a soldering process to protrude from the first frame part 36-1. The coupling protrusion 37C may be coupled to the coupling hole 37-1 of the module board 32. The coupling protrusion 37C may be manufactured as a separate structure to adhere to the first frame part 36-1. Thus, the coupling protrusion 37C may be provided with various shapes to improve a coupling force with the coupling hole 37-1.

Figure 24:
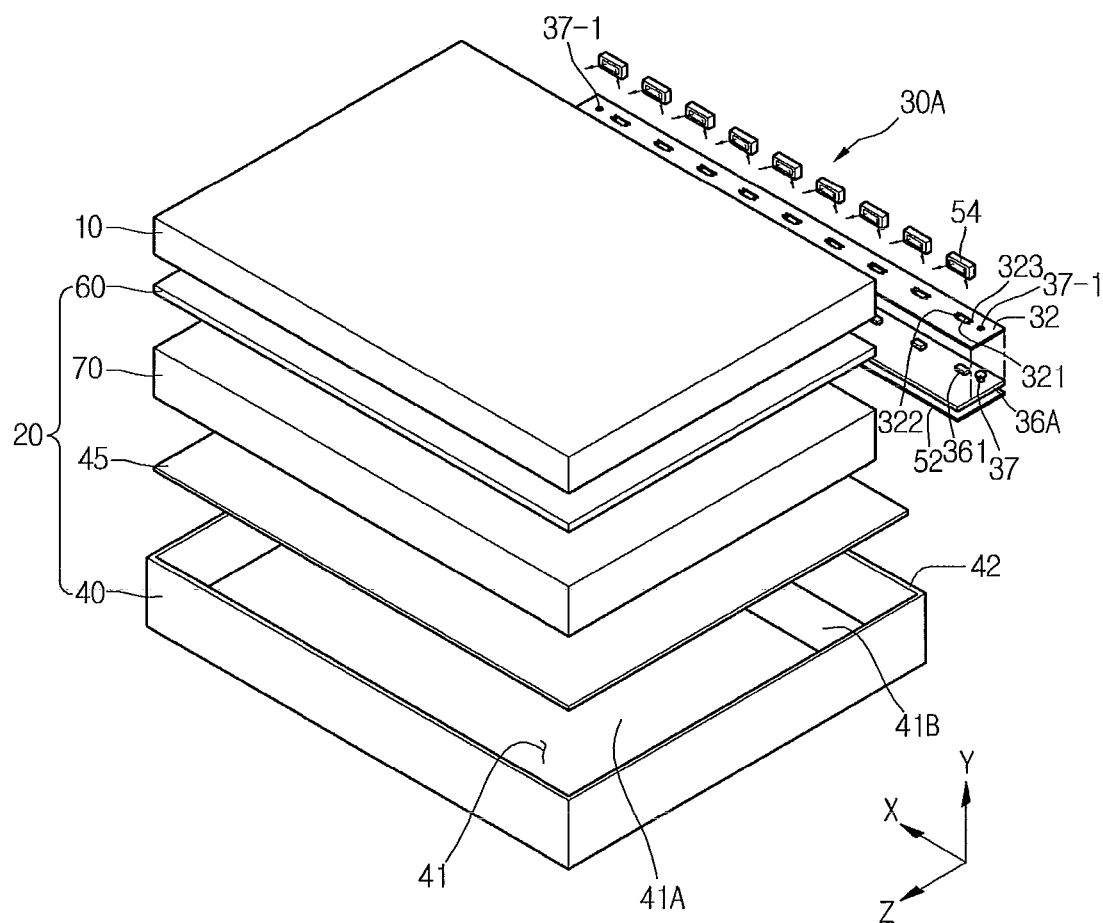
FIG. 24 is a side-sectional view of a display device including a backlight unit according to a tenth embodiment.
Figure 25:
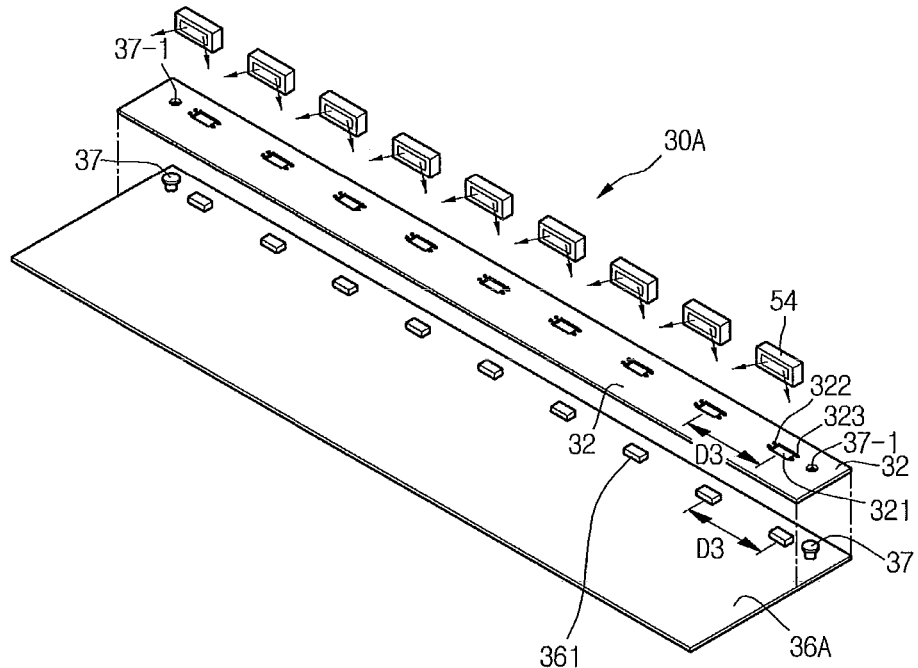
FIG. 25 is an exploded perspective view illustrating a light emitting module of FIG. 24.

FIG. 24 is a side-sectional view of a display device including a backlight unit according to a tenth embodiment. FIG. 25 is an exploded perspective view illustrating a light emitting module of FIG. 24. In description of the tenth embodiment, the same part as that of the first embodiment will be described with reference to the first embodiment.

Referring to FIGS. 24 and 25, a display device includes a display panel 10 and a backlight unit 20. The backlight unit 20 includes a bottom cover 40, a light emitting module 30A, a reflective member 45, an optical sheet 60, and a light guide plate 70. The light emitting module 30A includes a heatsink plate 36A, a module board 32, and a light emitting device 54. A plurality of first protrusions 361 may be disposed on the heatsink plate 36A. A plurality of holes 321 may be defined in the module board 32. Also, the light emitting device 54 may be provided in plurality on the module board 32.

The heatsink plate 36A may have a flat plate shape without being folded. In the light emitting device 54, a region in which the light emitting device 54 is mounted on the module board 32 may be perpendicular to a cavity region that is a light emission surface. That is, the light emitting device 54 may be mounted on first and second pads 322 and 332 of the module board 32 in a side view type.

In the current embodiment, when the module board 32 is coupled to the heatsink plate 36A, the protrusion 361 of the heatsink plate 36A is inserted into the hole 321 of the module board 32. Here, it may be unnecessary to provide a separate adhesion member between the module board 32 and the heatsink plate 36A. In this case, since a coupling hole 37-1 of the module board 32 is coupled to a coupling protrusion 37 of the heatsink plate 36A, the module board 32 may be primarily fixed to the heatsink plate 36A. Thereafter, since the light emitting device 34 adheres to the protrusion 361 of the heatsink plate 36A on the module board 32, the module board 32 may be supported by the light emitting device 34 and secondarily fixed.

Figure 26:
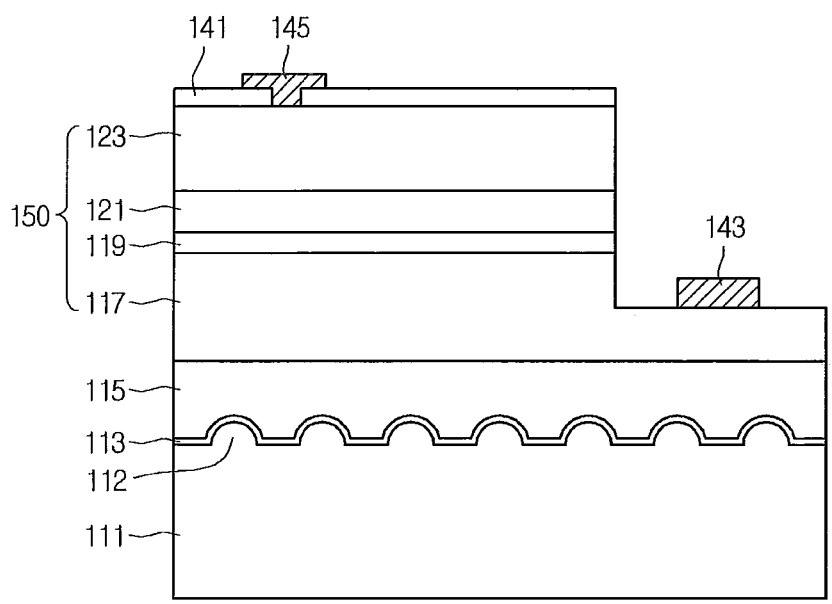
FIG. 26 is a side-sectional view illustrating a light emitting chip of a light emitting device according to an embodiment.

FIG. 26 is a view of a lighting emitting chip according to an embodiment.

Referring to FIG. 26, a light emitting chip 101 may includes a growth substrate 111, a buffer layer 113, a low conductive layer 115, a first conductive type semiconductor layer 117, an active layer 119, a second clad layer 121, and a second conductive type semiconductor layer 123.

The growth substrate 111 may include a transmissive, insulating, or conductive substrate. For example, the growth substrate 111 may be formed of at least one of sapphire ($Al_2O_3$), SiC, Si, GaAs, GaN, ZnO, GaP, InP, Ge, $Ga_2O_3$, and $LiGaO_3$. A plurality of protrusions 112 may be disposed on a top surface of the growth substrate 111. The plurality of protrusions 112 may be manufactured by etching the growth substrate 111. Alternatively, the plurality of protrusions 112 may be a separate light extraction structure such as a roughness. Each of the protrusions 112 may have a stripe shape, a hemisphere shape, or a dome shape. The growth substrate 111 may have a thickness of about 30 μm to about 150 μm, but is not limited thereto. The growth substrate 111 may be removed.

A plurality of compound semiconductor layers may be grown on the growth substrate 111. Equipment for growing the plurality of compound semiconductor layers on the growth substrate 111 may include an electron beam evaporator, a physical vapor deposition (PVD) device, a chemical vapor deposition (CVD) device, a plasma laser deposition (PLD) device, a dual-type thermal evaporator, a sputtering device, a metal organic chemical vapor deposition (MOCVD) device, and the like, but is not limed thereto.

A buffer layer 113 may be disposed on the growth substrate 111. The buffer layer 113 may be formed as at least one layer using a group II-VI compound semiconductor. The buffer layer 113 may include a semiconductor layer using a group III-V compound semiconductor. For example, the buffer layer 113 may include a semiconductor layer having a compositional formula of $In_xAl_yGa_{1-x-y}N$ ($0 \leq x \leq 1$, $0 \leq y \leq 1$, $0 \leq x+y \leq 1$). The buffer layer 113 may be formed of at least one of compound semiconductors such as GaN, InN, AlN, InGaN, AlGaN, InAlGaN, and AlInN. The buffer layer 113 may have a super lattice structure in which semiconductor layers different from each other are alternately disposed.

The buffer layer 113 may reduce a lattice constant difference between the growth substrate 111 and a nitride-based semiconductor layer. Also, the buffer layer 113 may be defined as a defect control layer. The buffer layer 113 may have a value corresponding to a lattice constant difference between a lattice constant of the growth substrate 111 and a lattice constant of the nitride-base semiconductor layer. The buffer layer 113 may be formed of oxide such as ZnO, but is not limited thereto. The buffer layer 113 may have a thickness of about 30 nm to about 500 nm, but is not limited thereto.

The low conductive layer 115 is disposed on the buffer layer 113. Also, the low conductive layer 115 may be an undoped semiconductor layer. The low conductive layer 115 may have conductivity less than that of the first conductive type semiconductor layer 117. The low conductive layer 115 may be realized as a GaN-based semiconductor using a group III-V compound semiconductor. The undoped semiconductor layer may have a first conductive property even though the undoped semiconductor layer is not doped with a conductive dopant. The undoped semiconductor layer may be omitted, but is not limited thereto. The low conductor layer 115 may be disposed between the plurality of first conductive type semiconductor layers 117. At least one or all of the buffer layer 113 and the low conductive layer 115 may be omitted.

The first conductive type semiconductor layer 117 may be disposed on the low conductive layer 115. The first conductive type semiconductor layer 117 may be formed of a group III-V compound semiconductor that is doped with a first conductive type dopant, e.g., a semiconductor material having a compositional formula of $In_xAl_yGa_{1-x-y}N$ ($0 \leq x \leq 1$, $0 \leq y \leq 1$, $0 \leq x+y \leq 1$). When the first conductive type semiconductor layer 117 is an N-type semiconductor layer, the first conductive type dopant may include N-type dopants such as Si, Ge, Sn, Se, and Te.

A super lattice structure in which first and second layers different from each other are alternately disposed may be disposed on at least one layer of the low conductive layer 115 and the first conductive type semiconductor layer 117. Each of the first and second layers may have a thickness of about several Å or more.

A first clad layer (not shown) may be disposed between the first conductive type semiconductor layer 117 and the active layer 119. The first clad layer may be formed of a GaN-based semiconductor. The first clad layer may restrict carriers. For another example, the first clad layer (not shown) may include an InGaN layer or an InGaN/GaN super lattice structure, but is not limited thereto. The first clad layer may be doped with an N-type and/or P-type dopant. For example, the first clad layer may be realized as a first conductive type or low conductive semiconductor layer.

The active layer 119 may be disposed on the first conductive type semiconductor layer 117. The active layer 119 may have at least one of a single well structure, a single quantum well structure, a multi well structure, a multi quantum well (MQW) structure, a quantum wire structure, and a quantum dot structure. The active layer 119 may include a well layer and a barrier layer which are alternately disposed. The well layer may be a well layer having a continuous energy level. Also, the well layer may be a quantum well having a quantized energy level. The well layer may be defined as a quantum well layer, and the barrier layer may be defined as a quantum barrier layer. A pair of the well layer and the barrier layer may be formed with about 2 periods to about 30 periods. For example, the wall layer may be formed of a semiconductor material having a compositional formula of $In_xAl_yGa_{1-x-y}N$ ($0 \leq x \leq 1$, $0 \leq y \leq 1$, $0 \leq x+y \leq 1$). The barrier layer 133 may be a semiconductor layer having a band gap wider than that of the well layer. For example, the barrier layer may be formed of a semiconductor material having a compositional formula of $In_xAl_yGa_{1-x-y}N$ ($0 \leq x \leq 1$, $0 \leq y \leq 1$, $0 \leq x+y \leq 1$). For example, the pair of well layer and barrier layer may be formed of at least one of InGaN/GaN, GaN/AlGaN, InGaN/AlGaN, InGaN/InGaN, and InAlGaN/InAlGaN.

The active layer 119 may selectively emit light within a range between an ultraviolet band and a visible light band. For example, the active layer 119 may emit light having a peak wavelength of about 420 nm to about 450 nm.

A second clad layer 121 is disposed on the active layer 119. The second clad layer 121 may have a band gap wider than that of the barrier layer of the active layer 110. The second clad layer 121 may be formed of a group III-V compound semiconductor, for example, a GaN-base semiconductor. For example, the second clad layer 121 may have a GaN, AlGaN, or InAlGaN super lattice structure. The second clad layer 121 may be doped with an N-type and/or P-type dopant. For example, the second clad layer 121 may be realized as a second conductive type or low conductive semiconductor layer.

A second conductive type semiconductor layer 123 is disposed on the second clad layer 121. The second conductive type semiconductor layer 123 may be doped with a second conductive type dopant. For example, the second conductive type semiconductor layer 123 may be formed of at least one of compound semiconductors such as GaN, InN, AlN, InGaN, AlGaN, InAlGaN, and AlInN. Also, the second conductive type semiconductor layer 123 may be provided as a single or multi layer. When the second conductive type semiconductor layer 123 is a P type semiconductor layer, the second conductive type dopant may include Mg, Zn, Ca, Sr, or Ba as a P type dopant.

The conductive types of the layers of a light emitting structure 150 may be reversely provided. For example, the second conductive type semiconductor layer 123 may be realized as an N-type semiconductor layer, and the first conductive type semiconductor layer 117 may be realized as a P-type semiconductor layer. Also, an N-type semiconductor layer that is a third conductive type semiconductor layer having a polarity opposite to that of the second conductive type may be further disposed on the second conductive type semiconductor layer 123. In the light emitting device 101, the first conductive type semiconductor layer 117, the active layer 119, and the second conductive type semiconductor layer 123 may be defined as a light emitting structure 150. The light emitting structure 150 may have at least one structure of an N—P junction structure, a P—N junction structure, an N—P—N junction structure, a P—N—P junction structure. An active layer may be disposed between two layers having the N—P or P—N junction structure. Also, at least one active layer may be disposed between three layers having the N—P—N or P—N—P junction structure.

An electrode layer 141 and a second electrode 145 are disposed on the light emitting structure 150. Also, a first electrode 143 is disposed on a first conductive type semiconductor layer 117.

The electrode layer 141 may serve as a current spreading layer. The electrode layer 141 may be formed of a material having transmitting and conductive properties. The electrode layer 141 may have a reflective index less than that of a compound semiconductor layer.

The electrode layer 141 is disposed on a top surface of the second conductive type semiconductor layer 123. The electrode layer 141 may include a metal oxide layer or a transmitting conductive layer. For example, the electrode layer 141 may be formed of one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), ZnO, $IrO_x$, $RuO_x$, and NiO. Here, the electrode layer 141 may be formed as at least one layer. The electrode layer 141 may include a reflective electrode layer. For example, the electrode layer 141 may be formed of one of Al, Ag, Pd, Rh, Pt, Ir and alloys of two or more materials thereof.

The second electrode 145 may be disposed on the second conductive type semiconductor layer 123 and/or the electrode layer 141. Also, the second electrode 145 may include an electrode pad. For example, the second electrode 145 may further include a current spreading pattern having an arm structure or a finger structure. The second electrode 145 may be formed of a metal having properties serving as an ohmiccontact layer, an adhesion layer, and a bonding layer and have a non-transmitting property, but are not limited thereto.

The first electrode 143 is disposed on a portion of the first conductive type semiconductor layer 117. For example, each of the first electrode 143 and the second electrode 145 may be formed of one of Ti, Ru, Rh, Ir, Mg, Zn, Al, In, Ta, Pd, Co, Ni, Si, Ge, Ag, Au, and alloys thereof.

An insulation layer may be further disposed on the light emitting device 101. The insulation layer may prevent the layers of the light emitting structure 150 from being short-circuited with each other and prevent moisture from being permeated.

The light emitting module according to the embodiments may be applied to illumination lamps, traffic lights, vehicle headlights, signs, and streetlights as well as a portable terminals and computers, but is not limited thereto. The light guide plate may be omitted on the top view type light emitting module, but is not limited thereto. A light transmitting material such as a lens or glass may be disposed on the light emitting module, but is not limited thereto.

According to the embodiments, the heat dissipation efficiency of the light emitting device may be improved. According to the embodiments, it may prevent the light emitting diode from being increased in temperature to improve the light efficiency of the light emitting device. According to the embodiments, the light emitting module including the light emitting device and the lighting system including the light emitting module may be improved in reliability.

The present disclosure is not limited to the above-described embodiments and the attached drawings, but limited to the following claims. It is evident that many alternative modifications and variations will be apparent to those having skill in the art in light of the foregoing description. Accordingly, the present invention embraces all such alternative modifications and variations as fall within the spirit and scope of the appended claims.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting module comprising:
a module board comprising a plurality of first and second pads on a first surface thereof and a plurality of first holes therein;
a heatsink plate corresponding to a second surface opposite to the first surface of the module board, the heatsink plate comprising a plurality of first protrusions respectively inserted into the first holes of the module board; and
a plurality of light emitting devices, each light emitting device comprising:
a heatsink frame connected to the first protrusions of the heatsink plate;
a light emitting chip disposed on a top surface of the heatsink frame;
a body coupled to the heatsink frame; and
first and second lead frames connected to the first and second pads of the module board,
wherein the heatsink plate comprises:
a first frame part on which the plurality of protrusions are disposed; and
a second frame part folded from the first frame part and disposed under the module board,
wherein the heatsink frame of each of the plurality of light emitting devices corresponds to one of the first protrusions of the heatsink plate,
wherein the module board comprises a second hole spaced from the first holes,
wherein the first frame part of the heatsink plate comprises a second protrusion coupled to the second hole of the module board,
wherein the second protrusion has a height greater than a height of the first protrusion,
wherein the second protrusion is located at an outer position than that of the plurality of first protrusions,
wherein the second hole is located at an outer position than that of the plurality of first holes, and
wherein the heatsink plate includes a plurality of third holes at a folded region between the first frame part and the second frame part.

2. The light emitting module according to claim 1, further comprising:
a first bonding member disposed between the first protrusions of the heatsink plate and the heatsink frame of the light emitting device;
a second bonding member adhered to the first pad; and
a third bonding member adhered to the second pad,
wherein the first bonding member does not contact the second and third bonding members.

3. The light emitting module according to claim 2, wherein a portion of the first bonding member is further disposed between the first protrusions of the heatsink plate and the first holes of the module board.

4. The light emitting module according to claim 1, wherein the first holes of the module board are disposed between the first pad and the second pad.

5. The light emitting module according to claim 1, wherein the module board comprises a resin-based board, and
wherein the heatsink plate comprises at least one metal layer.

6. The light emitting module according to claim 1, wherein the module board is spaced from a top surface of the second frame part.

7. The light emitting module according to claim 1, wherein the number of first protrusions of the heatsink plate is equal to that of light emitting devices.

8. The light emitting module according to claim 1, wherein each of the first protrusions of the heatsink plate has the same height as a thickness of the module board.

9. The light emitting module according to claim 1, wherein the second frame part of the heatsink plate has a width wider than a width of the first frame part, and wherein the second frame part of the heatsink plate has the width wider than a width of the module board, and wherein the second frame part of the heatsink plate has the width in a range of 6mm to 20 mm.

10. A light emitting module comprising:
a module board comprising a plurality of first and second pads on a first surface thereof and a plurality of first holes therein;
a heatsink plate corresponding to a second surface, the heatsink plate comprising a plurality of first protrusions respectively inserted into the first holes of the module board;
a plurality of light emitting devices, each light emitting device comprising:
a heatsink frame connected to the first protrusions of the heatsink plate; and
a light emitting chip disposed on a top surface of the heatsink frame, the plurality of light emitting devices being connected to the first and second pads of the module board; and
an adhesion member between the first protrusions of the heatsink plate and the heatsink frame of each of the light emitting devices,
wherein the heatsink plate comprises a plurality of metal layers, and the heatsink plate comprises:
a first frame part on which the module board is disposed, the first frame part comprising the plurality of first protrusions; and
a second frame part folded from the first frame part,
wherein the second frame part has a width wider than a width of the first frame part,
wherein the first frame part of the heatsink plate comprises a plurality of second protrusions coupled to the module board,
wherein each of the light emitting devices further comprises:
a body having a first cavity;
a first lead frame disposed within the first cavity, the first lead frame comprising a first lead part connected to one of the first pads of the module board;
a second lead frame spaced from the first lead frame, the second lead frame comprising a second lead part connected to one of the second pads of the module board; and
the heatsink frame comprising a third lead part connected to the first protrusions of the heatsink plate between the first and second lead frames,
wherein the first to third lead parts are exposed to a bottom surface of the body, and
wherein the heatsink plate includes a plurality of third holes at a folded region between the first frame part and the second frame part.

11. The light emitting module according to claim 10, wherein the heatsink plate comprises:
a first metal layer including an Al material and a second metal layer formed of a Ni alloy on the first metal layer.

12. The light emitting module according to claim 11, wherein the second metal layer is formed of the Ni alloy having at least one of W, Mo, Ag, Au, Pd, Cu, and Zn.

13. The light emitting module according to claim 11, wherein the second metal layer has a thickness less than that of the first metal layer.

14. The light emitting module according to claim 10, wherein the second frame part is folded at an angle of 90° with respect to the first frame part.

15. The light emitting module according to claim 13, wherein the heatsink frame further comprises a second cavity having a depth less than that of the first cavity,
wherein the second cavity is recessed from a bottom surface of the first cavity, and
wherein the heatsink frame and the light emitting chip are disposed on the second cavity.

16. The light emitting module according to claim 10, wherein the module board comprises a plurality of second holes spaced from the first holes,
wherein the plurality of second protrusions are coupled to the plurality of second holes of the module board, and
wherein the plurality of second protrusions have a height greater than a height of the first surface of the module board.

17. A backlight unit comprising:
a light guide plate;
a light emitting module disposed on at least one side surface of the light guide plate; and
a bottom cover in which the light guide plate and the light emitting module are disposed,
wherein the light emitting module comprises:
a module board comprising a plurality of first and second pads on a first surface thereof and a plurality of protrusion holes therein;
a heatsink plate corresponding to a second surface opposite to the first surface of the module board, the heatsink plate comprising a plurality of protrusions respectively inserted into the protrusion holes of the module board; and
a plurality of light emitting devices, each light emitting device comprising a heatsink frame connected to the protrusions of the heatsink plate, the plurality of light emitting devices being connected to the first and second pads of the module board,
wherein the heatsink plate comprises:
a first frame part on which the plurality of protrusions are disposed; and
a second frame part folded from the first frame part and disposed under the module board,
wherein the bottom cover includes a bottom part and a first sidewall folded from the bottom part,
wherein the bottom part includes a recess portion recessed from a surface of the bottom part,
wherein the second frame part of the heatsink plate is disposed in the recess portion of the bottom cover and the first frame part of the heatsink plate is adhered to the first sidewall of the bottom cover, and
wherein the second frame part has a width wider than a width of the first frame part and smaller than a width of the bottom of the bottom cover,
wherein a first adhesion member is disposed between the first frame part of the heatsink plate and the first sidewall, and
wherein a second adhesion member is disposed between the second frame part of the heatsink plate and the recess portion of the bottom cover.

18. A backlight unit according to claim 17, further comprising a reflective member disposed under the light guide plate,
wherein a portion of the reflective member is disposed between the plurality of light emitting devices and the second frame part of the heatsink plate.

* * * * *